(12) United States Patent
Mitsuno et al.

(10) Patent No.: US 11,296,111 B2
(45) Date of Patent: Apr. 5, 2022

(54) SEMICONDUCTOR MEMORY DEVICE AND MANUFACTURING METHOD OF SEMICONDUCTOR MEMORY DEVICE

(71) Applicant: KIOXIA CORPORATION, Tokyo (JP)

(72) Inventors: Yosuke Mitsuno, Yokkaichi Mie (JP); Tatsufumi Hamada, Nagoya Aichi (JP); Shinichi Sotome, Yokkaichi Mie (JP); Tomohiro Kuki, Yokkaichi Mie (JP); Yuya Akeboshi, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/800,812

(22) Filed: Feb. 25, 2020

(65) Prior Publication Data
US 2021/0028189 A1 Jan. 28, 2021

(30) Foreign Application Priority Data

Jul. 26, 2019 (JP) .............................. JP2019-137855

(51) Int. Cl.
| | | |
|---|---|---|
| H01L 27/11582 | (2017.01) | |
| H01L 27/11524 | (2017.01) | |
| H01L 27/1157 | (2017.01) | |
| H01L 27/11556 | (2017.01) | |
| H01L 21/28 | (2006.01) | |

(52) U.S. Cl.
CPC .... *H01L 27/11582* (2013.01); *H01L 27/1157* (2013.01); *H01L 27/11524* (2013.01); *H01L 27/11556* (2013.01); *H01L 29/40114* (2019.08); *H01L 29/40117* (2019.08)

(58) Field of Classification Search
None
See application file for complete search history.

(56) References Cited

U.S. PATENT DOCUMENTS

| | | | |
|---|---|---|---|
| 2015/0043283 A1 | 2/2015 | Kwak et al. | |
| 2019/0189218 A1 | 6/2019 | Izumi et al. | |
| 2019/0198522 A1 | 6/2019 | Takekida | |
| 2019/0214405 A1 | 7/2019 | Shirai et al. | |
| 2020/0185409 A1* | 6/2020 | Baek | H01L 27/11565 |

\* cited by examiner

*Primary Examiner* — Bo B Jang
(74) *Attorney, Agent, or Firm* — Kim & Stewart LLP

(57) ABSTRACT

According to one embodiment, a semiconductor memory device includes a stacked body of first conductor layers and second conductor layers. A pillar including a semiconductor layer extends along through the stacked body in a first direction. A charge storage layer is between the conductor layers and the semiconductor layer. The semiconductor layer includes a first portion extending along the first direction from an uppermost first conductor layer to a lowermost second conductor layer and a second portion above the first portion in the first direction. The second portion has a diameter that decreases with increasing distance along the first direction from the first portion.

14 Claims, 32 Drawing Sheets

SEMICONDUCTOR MEMORY DEVICE AND MANUFACTURING METHOD OF SEMICONDUCTOR MEMORY DEVICE

CROSS-REFERENCE TO RELATED APPLICATION(S)

This application is based upon and claims the benefit of priority from Japanese Patent Application No. 2019-137855, filed Jul. 26, 2019, the entire contents of which are incorporated herein by reference.

FIELD

Embodiments described herein relate generally to a semiconductor memory device and a manufacturing method of the semiconductor memory device.

BACKGROUND

As a semiconductor memory device capable of storing data in a nonvolatile manner, a NAND flash memory is known. A semiconductor memory device such as the NAND flash memory can employ a three-dimensional memory structure for high integration and large storage capacity. In the three-dimensional memory structure, a memory pillar can be provided above a substrate, and a memory cell group (e.g., a NAND string) including a plurality of memory cells can be formed with the memory pillar. A memory hole corresponding to where the memory pillar is ultimately formed can be formed in two parts, a lower portion and an upper portion.

DETAILED DESCRIPTION

Figure 1:
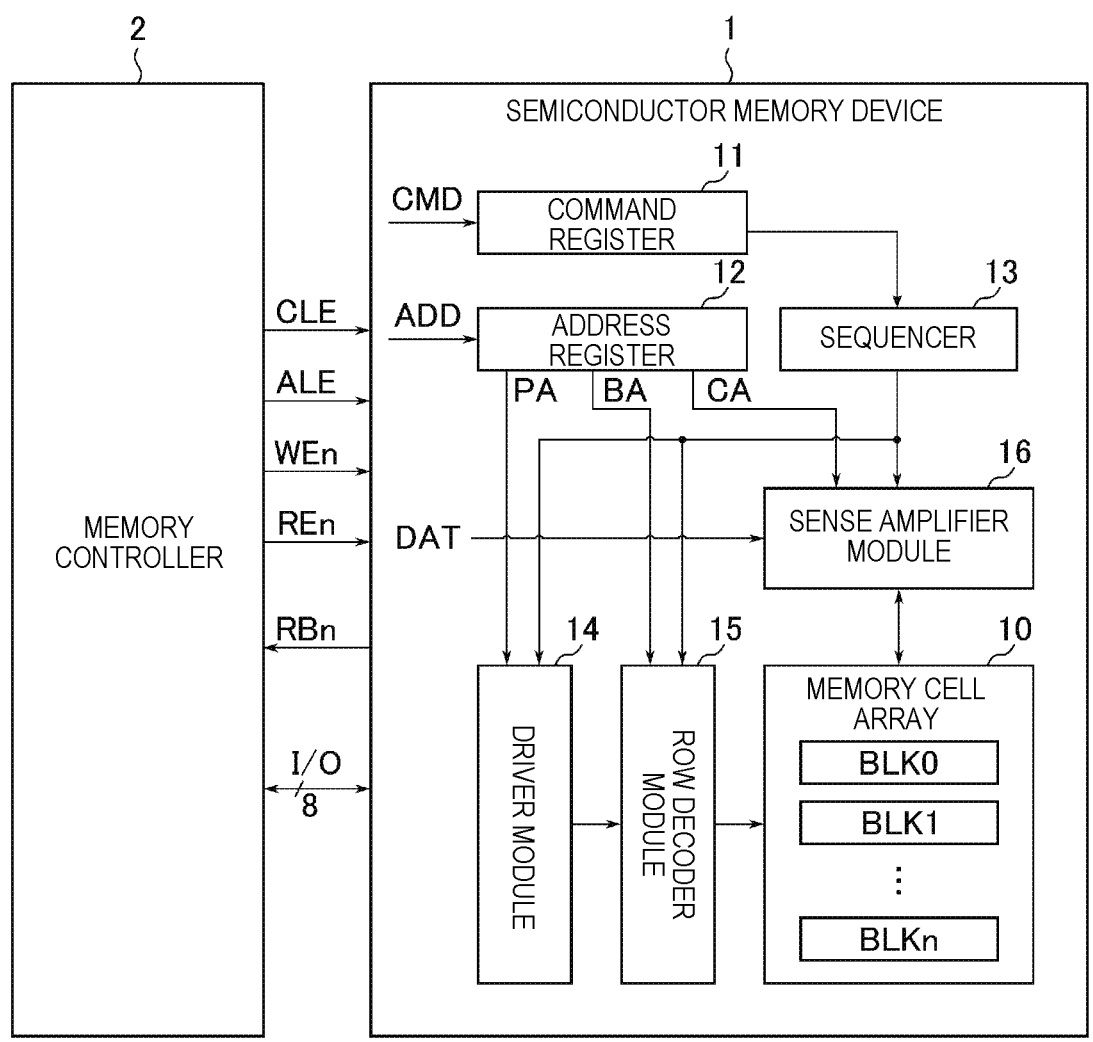
FIG. 1 is a block diagram illustrating an overall configuration of a memory system including a semiconductor memory device according to a first embodiment.

In general, according to one embodiment, a semiconductor memory device comprises a stacked body including a plurality of first conductor layers and a plurality of second conductor layers stacked above the plurality of first conductor layers in a first direction. A pillar including a semiconductor layer, the pillar extends along the first direction within the stacked body. A charge storage layer is between the plurality of first conductor layers and the semiconductor layer and between the plurality of second conductor layers and the semiconductor layer. The semiconductor layer has a first portion extending along the first direction from an uppermost first conductor layer among the plurality of first conductor layers to a lowermost second conductor layer among the plurality of second conductor layers and a second portion above the first portion in the first direction. The second portion has a diameter that decreases (tapers) with increasing distance along the first direction from the first portion.

Hereinafter, certain example embodiments of the present disclosure will be described with reference to the drawings. The drawings are schematic or conceptual, and the dimensions and ratios sizes depicted in the drawings are not necessarily the same as actual ones. The technical idea of the present disclosure is not necessarily limited to the shape, structure, arrangement, and the like of the components depicted in the drawings.

In the following description, components having substantially the same functions and configurations are denoted with the same reference numerals. If numbers or additional characters are appended to a reference numeral or the like, then such appended numbers/characters are being used to distinguish between elements of the overall type. If it is not necessary to distinguish between different instances of the same element type, then each instance of the same element type can be referenced by a reference sign without appended numbers/characters.

In the specification, "film thickness" indicates, for example, the difference between the inner diameter and the outer diameter of a component. The "inner diameter" and "outer diameter" of a certain component respectively mean the average diameter of the inner sides and the average diameter of the outer sides of the component when the component is cut in a cross section parallel to the layered surface of the stacked body stacked on the substrate. "Diameter" can mean "outer diameter" or "inner diameter" according to context.

In the specification, the fact that portions of two components that are close are "facing" indicates that each of the portions of the two components includes a surface substantially parallel to each other, and the parallel surfaces are formed to face each other.

1. First Embodiment

A semiconductor memory device according to a first embodiment will be described.

1.1 Configuration

First, the configuration of the semiconductor memory device according to the first embodiment will be described.

1.1.1 Semiconductor Memory Device

FIG. 1 is a block diagram for illustrating a configuration of the semiconductor memory device according to the first embodiment. Semiconductor memory device 1 is a NAND flash memory capable of storing data in a nonvolatile manner, and is controlled by an external memory controller 2. Communication between the semiconductor memory device 1 and the memory controller 2 supports, for example, the NAND interface standard.

As illustrated in FIG. 1, the semiconductor memory device 1 includes, for example, a memory cell array 10, a command register 11, an address register 12, a sequencer 13, a driver module 14, a row decoder module 15, and a sense amplifier module 16.

The memory cell array 10 includes a plurality of blocks BLK0 to BLKn (where n is an integer of 1 or more). The block BLK is a set of a plurality of memory cells capable of storing data in a nonvolatile manner, and is used as a data erasing unit, for example. The memory cell array 10 is provided with a plurality of bit lines and a plurality of word lines. Each memory cell is associated with, for example, one bit line and one word line.

The command register 11 stores a command CMD received by the semiconductor memory device 1 from the memory controller 2. The command CMD includes, for example, commands for causing the sequencer 13 to execute a read operation, a write operation, an erasing operation, and the like.

The address register 12 stores address information ADD received by the semiconductor memory device 1 from the memory controller 2. The address information ADD includes, for example, a block address BA, a page address PA, and a column address CA. For example, the block address BA, the page address PA, and the column address CA are used to select a block BLK, a word line, and a bit line, respectively.

The sequencer 13 controls the operation of the entire semiconductor memory device 1. For example, the sequencer 13 controls the driver module 14, the row decoder module 15, the sense amplifier module 16, and the like based on the command CMD stored in the command register 11, and executes a read operation, a write operation, an erasing operation, and the like.

The driver module 14 generates voltage used in a read operation, a write operation, an erasing operation, and the like. The driver module 14 applies a generated voltage to the signal line corresponding to the selected word line based on, for example, the page address PA stored in the address register 12.

The row decoder module 15 selects one block BLK in the corresponding memory cell array 10 based on the block address BA stored in the address register 12. Then, the row decoder module 15 transfers, for example, a voltage applied to the signal line corresponding to the selected word line, to the selected word line in the selected block BLK.

In the write operation, the sense amplifier module 16 applies a desired voltage to each bit line according to the write data DAT received from the memory controller 2. In the read operation, the sense amplifier module 16 determines data stored in the memory cell based on the voltage of the bit line, and transmits the determination result to the memory controller 2 as read data DAT.

The semiconductor memory device 1 and the memory controller 2 described above may be configured as one semiconductor device by combining the semiconductor memory device 1 and the memory controller 2. Examples of such a semiconductor device include a memory card such as an SD™ card and a solid state drive (SSD).

1.1.2 Circuit Configuration of Memory Cell Array

Figure 2:
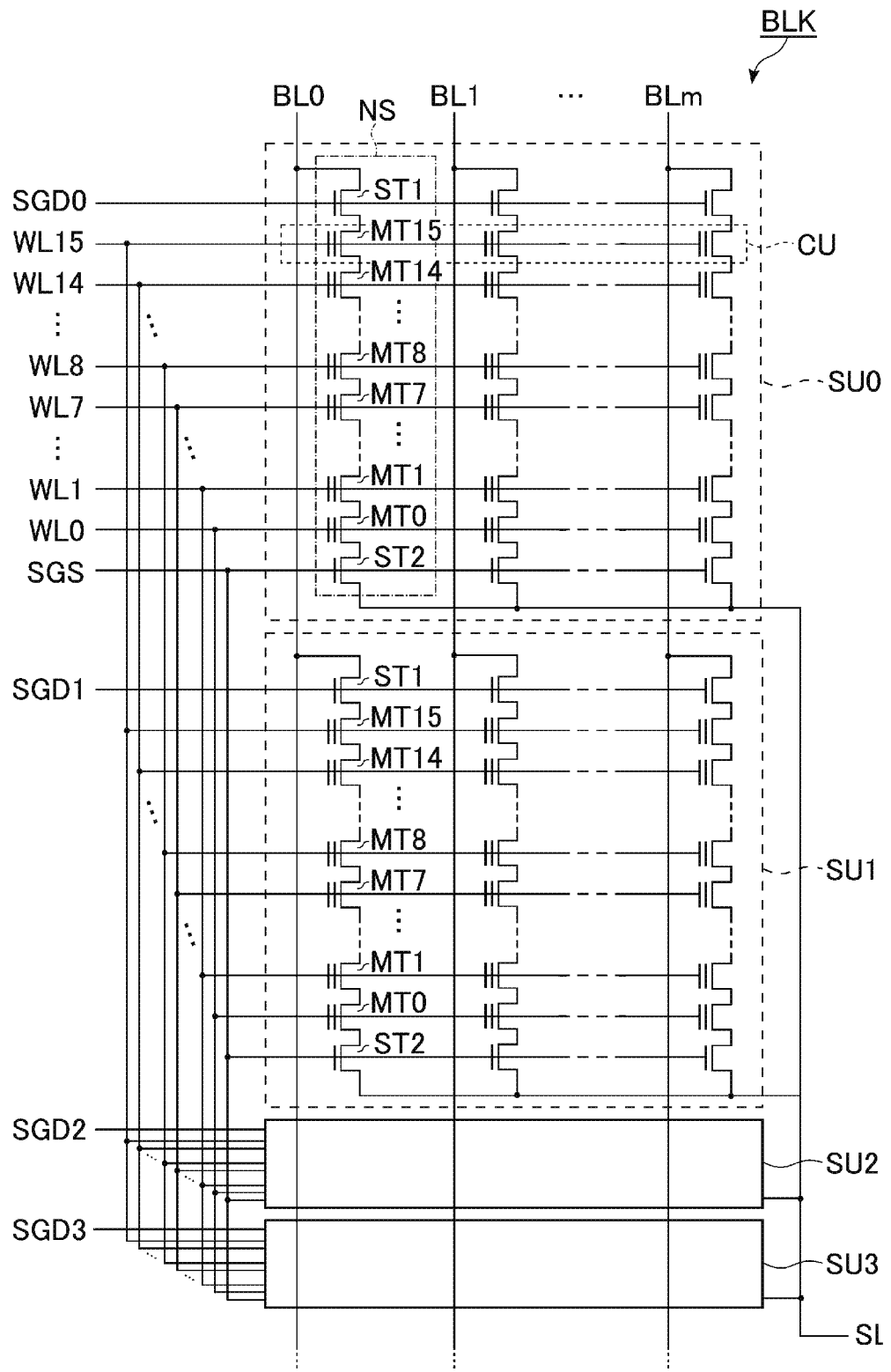
FIG. 2 is a circuit configuration diagram illustrating a memory cell array portion of the semiconductor memory device.

FIG. 2 is a circuit diagram for illustrating a configuration of the memory cell array of the semiconductor memory device according to the first embodiment. FIG. 2 illustrates one block BLK among a plurality of blocks BLK in the memory cell array 10.

As illustrated in FIG. 2, the block BLK includes, for example, four string units SU0 to SU3. Each string unit SU includes a plurality of NAND strings NS respectively associated with the bit lines BL0 to BLm (where m is an integer of 1 or more). Each NAND string NS includes, for example, memory cell transistors MT0 to MT7 and select transistors ST1 and ST2. The memory cell transistor MT includes a control gate and a charge storage layer, and stores data in a nonvolatile manner. Each of the select transistors ST1 and ST2 is used for the selection of the string unit SU during various operations.

In each NAND string NS, the memory cell transistors MT0 to MT15 are connected in series. The drain of the select transistor ST1 is connected to the associated bit line BL, and the source of the select transistor ST1 is connected to one end of the memory cell transistors MT0 to MT15 which are connected in series. The drain of the select transistor ST2 is connected to the other end of the memory cell transistors MT0 to MT15 which are connected in series. The source of the select transistor ST2 is connected to the source line SL.

In the same block BLK, the control gates of the memory cell transistors MT0 to MT15 are commonly connected to the word lines WL0 to WL15, respectively. The gates of the select transistors ST1 in the string units SU0 to SU3 are commonly connected to select gate lines SGD0 to SGD3, respectively. The gates of the select transistors ST2 are commonly connected to a select gate line SGS.

In the circuit configuration of the memory cell array 10 described above, the bit line BL is shared by the NAND strings NS to which the same column address is assigned in each string unit SU. For example, the source line SL is shared among a plurality of blocks BLK.

A set of a plurality of memory cell transistors MT connected to a common word line WL in one string unit SU is referred to as a cell unit CU, for example. For example, the storage capacity of the cell unit CU including the memory cell transistors MT each storing 1-bit data is defined as "one page data". The cell unit CU can have a storage capacity of two or more page data depending on the number of bits of data stored in the memory cell transistor MT.

The circuit configuration of the memory cell array 10 in the semiconductor memory device 1 according to the first embodiment is not limited to the configuration described above. For example, each NAND string NS may include any number of memory cell transistors MT and any number of select transistors ST1 and ST2. Each block BLK may also include any number of string units SU.

1.1.3 Structure of Memory Cell Array

Hereinafter, an example of the structure of the memory cell array of the semiconductor memory device according to the first embodiment will be described.

In the drawings referred to below, the Y direction corresponds to the extending direction of the bit line BL, and the Z direction corresponds to the vertical direction with respect to the surface of the semiconductor substrate 20 on which the semiconductor memory device 1 is formed. The X direction is a direction that intersects the Y direction on a plane parallel to the surface of the semiconductor substrate 20. In the cross-sectional view, components such as an insulating layer (interlayer insulating film), wiring, and contacts are appropriately omitted for easy understanding of the drawing.

Figure 3:
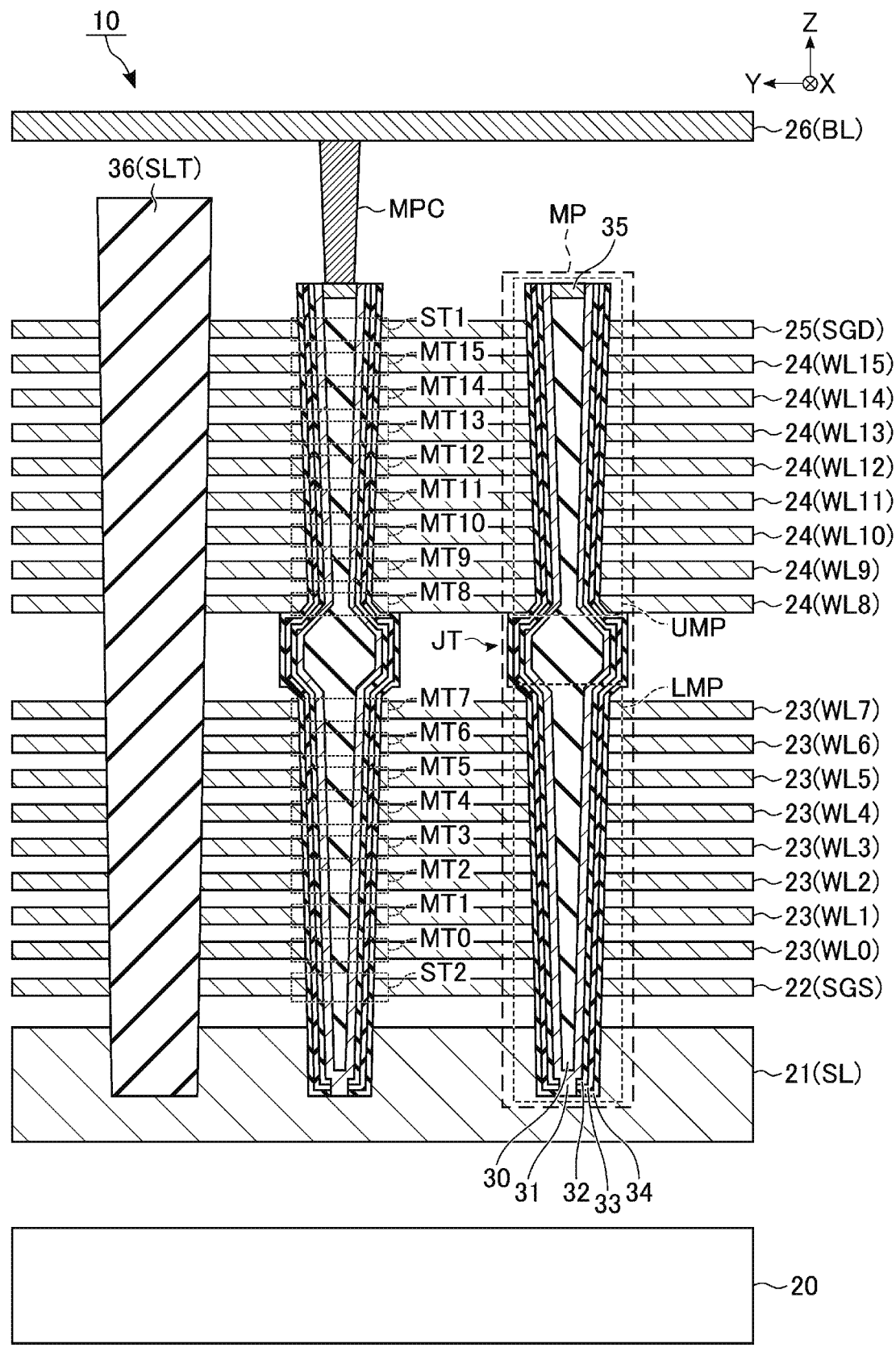
FIG. 3 is a cross-sectional view of a memory cell array of the semiconductor memory device.

FIG. 3 illustrates an example of a cross-sectional structure of the memory cell array 10 of the semiconductor memory device according to the first embodiment. As illustrated in FIG. 3, the memory cell array 10 includes conductor layers 21 to 25, for example. The conductor layers 21 to 25 are provided above the semiconductor substrate 20.

As illustrated in FIG. 3, a conductor layer 21 is provided above the semiconductor substrate 20 via an insulator layer (not separately illustrated). A circuit such as the sense amplifier module 16 may be provided on the insulator layer. The conductor layer 21 is formed, for example, in a plate shape extending along the XY plane and serves as the source line SL. The conductor layer 21 includes, for example, silicon.

A conductor layer 22 is provided above the conductor layer 21 via an insulator layer. The conductor layer 22 is used as the select gate line SGS.

A plurality of insulator layers and conductor layers 23 are alternately stacked above the conductor layer 22. For example, the conductor layers 23 are used as the word lines WL0 to WL7 in order from the semiconductor substrate 20 side.] A plurality of insulator layers and conductor layers 24 are alternately stacked above the conductor layer 23 stacked as the uppermost layer. For example, the conductor layers 24 are used as the word lines WL8 to WL15 in order from the semiconductor substrate 20 side.

The interval in the Z direction between the uppermost conductor layer 23 and the lowermost conductor layer 24 is larger than the interval in the Z direction between adjacent conductor layers 23 or between adjacent conductor layers 24. That is, the thickness of the insulator layer between the uppermost conductor layer 23 and the lowermost conductor layer 24 is thicker than that of the insulator layer between adjacent conductor layers 23 or between adjacent conductor layers 24. Between the uppermost conductor layer 23 and the lowermost conductor layer 24, a joint portion of a memory pillar is formed.

A conductor layer 25 is provided above the conductor layer 24 stacked as the uppermost layer via an insulator layer. The conductor layer 25 is used as the select gate line SGD.

The conductor layers 22 to 25 are formed, for example, in a plate shape extending along the XY plane, and include, for example, tungsten (W).

A conductor layer 26 is provided above the conductor layer 25 via an insulator layer. For example, the conductor layer 26 extends along the Y axis, and a plurality of conductor layers 26 are arranged along the X axis in a line shape, each of which is used as a bit line BL. The conductor layer 26 includes, for example, copper (Cu).

The memory pillar MP is provided to extend along the Z axis, penetrates the conductor layers 22 to 25, and the bottom thereof is in contact with the conductor layer 21. The memory pillar MP includes a lower pillar LMP, an upper pillar UMP formed above the lower pillar LMP, and a joint portion JT connecting the lower pillar LMP and the upper pillar UMP.

The joint portion JT is formed in a portion between the uppermost conductor layer 23 and the lowermost conductor layer 24 in the memory pillar MP. The lower pillar LMP and the upper pillar UMP respectively correspond to the lower and upper portions of the joint portion JT in the memory pillar MP. The upper end of the lower pillar LMP is in contact with the lower end of the joint portion JT above the upper surface of the uppermost conductor layer 23, and the lower end of the upper pillar UMP is in contact with the upper end of the joint portion JT below the lower surface of the lowermost conductor layer 24. The joint portion JT may include, for example, a portion having a diameter larger than the maximum value of the diameter of the lower pillar LMP and larger than the maximum value of the diameter of the upper pillar UMP.

The lower pillar LMP has a tapered shape whose diameter increases from the lower side to the upper side. Therefore, the diameter of the lower pillar LMP is smallest (minimized) at the portion in contact with the conductor layer 21, and largest (maximized) at the portion in contact with the joint portion JT.

The upper pillar UMP has a constricted shape such that the diameter is at one point reduced from the lower side toward the upper side and then the diameter is increased again toward the upper side. Therefore, the diameter of the upper pillar UMP is at a minimum above the portion in contact with the joint portion JT. In this context, a constricted shape refers to a shape for which the portion where its diameter is at a minimum is not located at the end portion of the shape but rather at an intermediate portion away from the endmost portion nearest to the joint portion JT.

The memory pillar MP includes, for example, a core member 30, a semiconductor layer 31, a tunnel insulating film 32, a charge storage layer 33, a block insulating film 34, and a semiconductor portion 35. Each of the core member 30, the semiconductor layer 31, the tunnel insulating film 32, the charge storage layer 33, and the block insulating film 34 is formed as a continuous film in the lower pillar LMP, the joint portion JT, and the upper pillar UMP.

Specifically, the core member 30 is provided substantially at the center of the lower pillar LMP and extends along the Z axis. The upper end of the core member 30 is located, for example, above the conductor layer 25, and the lower end thereof is located, for example, in the layer of the conductor layer 21. The core member 30 includes an insulator such as silicon oxide ($SiO_2$).

The semiconductor layer 31 covers the bottom surface and the side surface of the core member 30 and includes, for example, a cylindrical portion formed along the Z axis to surround the entire side surface of the core member 30. The lower end of the semiconductor layer 31 is in contact with the conductor layer 21, and the upper end thereof is located above the conductor layer 25. The semiconductor layer 31 includes, for example, polysilicon.

The tunnel insulating film 32 covers the side surface of the semiconductor layer 31 and includes, for example, a cylindrical portion formed along the Z axis to surround the entire side surface of the semiconductor layer 31. The tunnel insulating film 32 includes an insulator such as silicon oxide ($SiO_2$).

The charge storage layer 33 covers the side surface of the semiconductor layer 32 and includes, for example, a cylindrical portion formed along the Z axis to surround the entire side surface of the semiconductor layer 32. The charge storage layer 33 includes, for example, silicon nitride (SiN).

The block insulating film 34 covers the side surface of the charge storage layer 33 and includes, for example, a cylindrical portion formed along the Z axis to surround the entire side surface of the charge storage layer 33. The block insulating film 34 includes an insulator such as silicon oxide (SiO$_2$).

The semiconductor portion 35 covers the upper surface of the core member 30 and contacts the inner wall portion of the semiconductor layer 31 above the core member 30 and the lower end of the contact MPC formed immediately above the semiconductor portion 35. The semiconductor portion 35 has, for example, a cylindrical shape and reaches the upper end of the upper pillar UMP.

The columnar contact MPC is provided on the upper surfaces of the semiconductor layer 31 and the semiconductor portion 35 in the memory pillar MP. In the cross-sectional view of FIG. 3, a contact MPC corresponding to one memory pillar MP out of the two memory pillars MP is illustrated. The remaining one memory pillar MP in which the contact MPC is not illustrated is provided with the contact MPC in the cross section on the depth side or the near side in FIG. 3. The upper surface of each contact MPC is in contact with a corresponding conductor layer 26 (e.g., a bit line BL) and is thus electrically connected.

An insulator layer 36 is formed, for example, in a plate shape along the XZ plane, and functions as a slit SLT that divides the conductor layers 22 to 25 along the Y axis. By the insulator layer 36, the conductor layers 22 to 25 are divided, for example, for each block BLK. The upper end of the insulator layer 36 is located between the conductor layer 25 and the conductor layer 26, and the lower end thereof is located, for example, in the layer in which the conductor layer 21 is provided. The insulator layer 36 includes an insulator such as silicon oxide (SiO$_2$).

The upper and lower ends of the insulator layer 36 and the upper and lower ends of the memory pillar MP may or may not be aligned.

In the structure of the memory pillar MP described above, a portion where the lower pillar LMP intersects the conductor layer 22 functions as the select transistor ST2. Portions where the lower pillar LMP intersects the conductor layers 23 function as the memory cell transistors MT0 to MT7. Portions where the upper pillar UMP intersects the conductor layers 24 function as the memory cell transistors MT8 to MT15. A portion where the upper pillar UMP intersects the conductor layer 25 functions as the select transistor ST1.

That is, the semiconductor layer 31 is used as a channel of each of the memory cell transistors MT and the select transistors ST1 and ST2. Accordingly, each memory pillar MP functions, for example, as one NAND string NS.

The structure of the memory cell array 10 described above is merely an example, and the memory cell array 10 may have other structures. For example, the number of conductor layers 23 and 24 is determined based on the number of word lines WL. A plurality of conductor layers 22 and 25 provided in a plurality of layers may be assigned to the select gate lines SGS and SGD, respectively. When the select gate line SGS is provided in a plurality of layers, a conductor different from the conductor layer 22 may be used. The memory pillar MP and the conductor layer 25 may be electrically connected via two or more contacts, or may be electrically connected via other wirings. The slit SLT may include a plurality of types of insulators.

Figure 4:
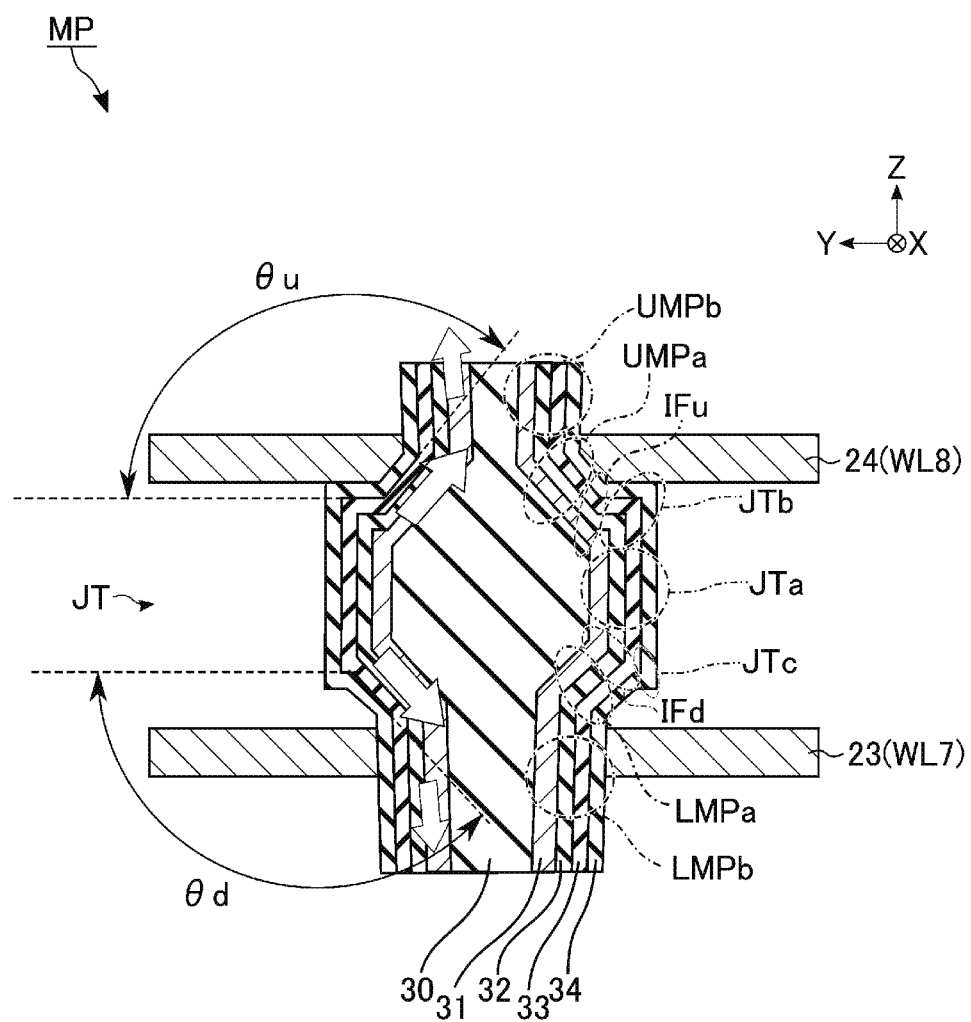
FIG. 4 is a cross-sectional view of a portion including a joint portion in a memory pillar of the semiconductor memory device.

FIG. 4 illustrates an enlarged cross-sectional structure of a portion including the joint portion JT in the memory pillar MP illustrated in FIG. 3.

In the following description, "the tunnel insulating film 32, the charge storage layer 33, and the block insulating film 34" may be simply referred to as "stacked films". "The interface between the tunnel insulating film 32 and the charge storage layer 33 or the interface between the charge storage layer 33 and the block insulating film 34" may be simply referred to as "an interface between the stacked films".

As illustrated in FIG. 4, the joint portion JT includes portions JTa, JTb, and JTc, the upper pillar UMP includes portions UMPa and UMPb, and the lower pillar LMP includes portions LMPa and LMPb.

The portion JTa is a portion where the stacked films in the memory pillar MP or the interfaces between stacked films are formed along the axis (e.g., Z axis) in which the memory pillar MP extends.

First, details of the configuration above the portion JTa will be described.

The portion JTb is a portion where the stacked films or the interfaces between stacked films above the portion JTa are formed along the axis (for example, Y axis) in the plane (XY plane) which is parallel to the layered surface of the conductor layers 23 and 24. In the portion JTb, the block insulating film 34 may be provided in contact with the lowermost conductor layer 24 and above the charge storage layer 33 along the Z axis, and the charge storage layer 33 may be provided above the tunnel insulating film 32 along the Z axis. The tunnel insulating film 32 may be provided above the semiconductor layer 31 along the Z axis. The portion JTb is located at the upper end of the joint portion JT and is connected to the portion UMPa of the upper pillar UMP via a boundary IFu.

The boundary IFu is a portion where the semiconductor layer 31 and the stacked films change from a portion extending along the axis in the XY plane to a portion extending along the axis intersecting the XY plane above the portion JTa. The interface between the stacked films forms an obtuse angle θu (θu>90 degrees) toward the outside of the memory pillar MP at the boundary IFu. That is, the semiconductor layer 31 and the stacked films in the portion UMPa extend in a direction approaching the center of the memory pillar MP as going upward from the boundary IFu. In other words, the diameters of the semiconductor layer 31 and the stacked films in the portion UMPa decrease in the upward direction from the boundary IFu.

The upper end of the portion UMPa is connected to the portion UMPb. The semiconductor layer 31 and the stacked films in the portion UMPb extend in a direction away from the center of the memory pillar MP as going upward from the upper end of the portion UMPa. In other words, the diameters of the semiconductor layer 31 and the stacked films in the portion UMPb increase in the upward direction from the upper end of the portion UMPa. Thus, the upper pillar UMP has a constricted shape with a minimum diameter at the boundary between the portion UMPa and the portion UMPb.

The lowermost conductor layer 24 may be in contact with the block insulating film 34 in the portion JTb, and the block insulating film 34 in the portion UMPa, and may be in contact with the block insulating film 34 in the portion UMPb. That is, the lowermost conductor layer 24 includes a surface facing the stacked films in the portion UMPa. The area of the portion of the lowermost conductor layer 24 parallel to the layered surface (XY plane) is smaller on the lower surface than on the upper surface.

Next, details of the configuration below the portion JTa will be described.

The portion JTc is a portion where the stacked films or the interfaces between stacked films below the portion JTa are formed along the axis (for example, Y axis) in the plane (XY plane) parallel to the layered surface of the conductor layers 23 and 24. In the portion JTc, the block insulating film 34 may be provided below the charge storage layer 33 along the Z axis, and the charge storage layer 33 may be provided below the tunnel insulating film 32 along the Z axis. The tunnel insulating film 32 may be provided below the semiconductor layer 31 along the Z axis. The portion JTc is located at the lower end of the joint portion JT and is connected to the portion LMPa of the lower pillar LMP via a boundary IFd.

The boundary IFd is a portion where the semiconductor layer 31 and the stacked films change from a portion extending along the axis in the XY plane to a portion extending along the axis intersecting the XY plane below the portion JTa. The interface between the stacked films forms an obtuse angle θd (θd>90 degrees) toward the outside of the memory pillar MP at the boundary IFd. That is, the semiconductor layer 31 and the stacked films in the portion LMPa extend in a direction approaching the center of the memory pillar MP as going downward from the boundary IFd. In other words, the diameters of the semiconductor layer 31 and the stacked films in the portion LMPa decrease in the downward direction from the boundary IFd.

The lower end of the portion LMPa is connected to the portion LMPb. The semiconductor layer 31 and the stacked films in the portion LMPb extend in a direction gradually approaching the center of the memory pillar MP as going downward from the lower end of the portion LMPa than the semiconductor layer 31 and the stacked films in the portion LMPa. In other words, the diameters of the semiconductor layer 31 and the stacked films in the portion LMPb decrease at a slower rate than those of the semiconductor layer 31 and the stacked films in the portion LMPa in the downward direction from the lower end of the portion LMPa. Therefore, the lower pillar LMP has a tapered shape having a two-step inclination.

The joint portion JT may be connected to the lower pillar LMP without passing through the portion JTc. Here, the boundary IFd becomes a portion where the portion extending along the Z axis intersects the portion extending along the axis intersecting the Z axis and the XY plane below the portion JTa in the interface between the stacked films.

1.2 Manufacturing Method of Semiconductor Memory Device

Hereinafter, an example of a series of manufacturing processes from the formation of the stacked structure corresponding to the word lines WL to the formation of the select gate line SGD in the semiconductor memory device according to the first embodiment will be described. Each of FIGS. 5 to 21 illustrates an example of a cross-sectional structure including a structure body corresponding to the memory cell array in the manufacturing process of the semiconductor memory device according to the first embodiment. The cross-sectional view of the manufacturing process referred to below includes a cross section perpendicular to the surface of the semiconductor substrate 20. The region displayed in the cross-sectional view of each manufacturing process includes a region where the two memory pillars MP and the slit SLT are formed.

Figure 5:
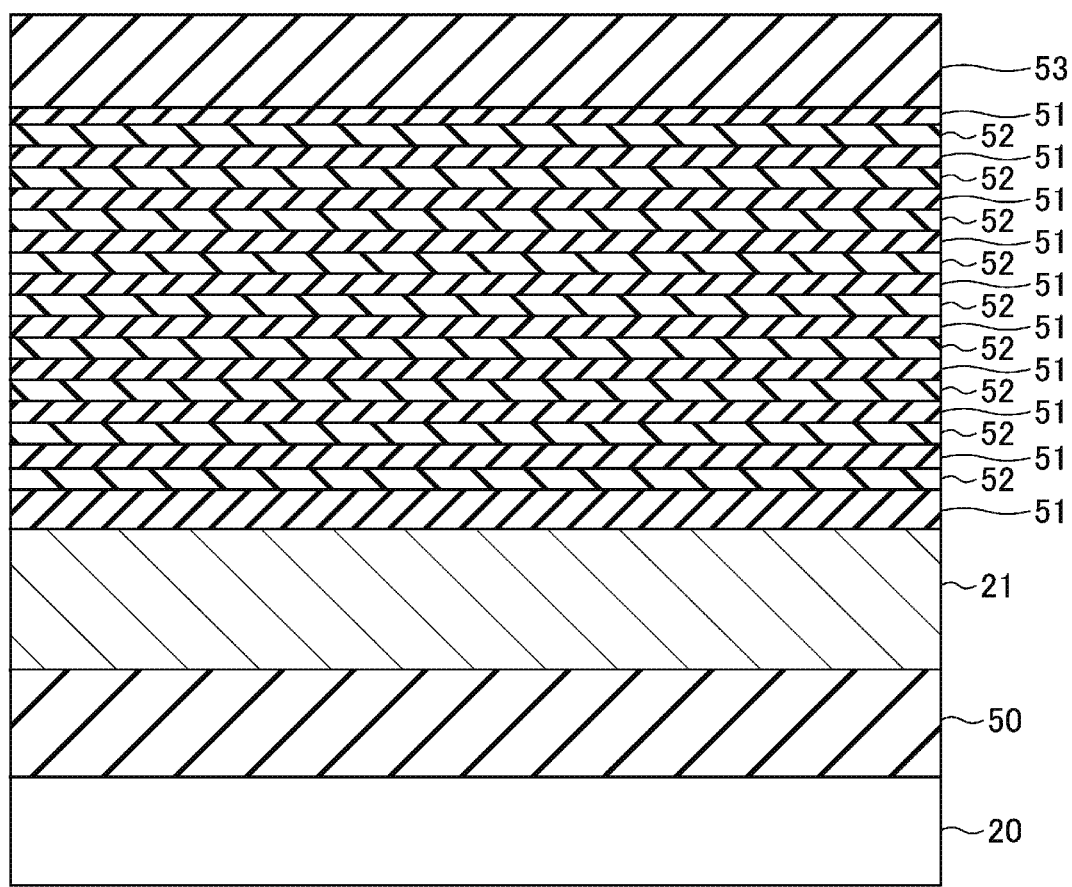
FIGS. 5 to 21 are cross-sectional views of a memory cell array for illustrating aspects of a manufacturing process of a semiconductor memory device.

First, as illustrated in FIG. 5, a plurality of sacrificial materials 52 corresponding to the select gate line SGS and the word lines WL0 to WL7 are stacked. Specifically, first, an insulator layer 50, the conductor layer 21, and an insulator layer 51 are stacked in order on the semiconductor substrate 20. On the insulator layer 51, the sacrificial materials 52 and the insulator layers 51 are alternately stacked a plurality of times. Then, an insulator layer 53 is further stacked on the uppermost insulator layer 51. The insulator layer 53 corresponds to a portion where the joint portion JT is formed, and is formed thicker than, for example, the insulator layer 51 and an insulator layer 56.

The insulator layers 51 and 53 include, for example, silicon oxide ($SiO_2$). The number of layers of which the sacrificial materials 52 are formed corresponds to the number of select gate line SGS and the word lines WL of the lower pillar LMP to be stacked. The sacrificial material 52 includes, for example, silicon nitride (SiN).

Figure 6:
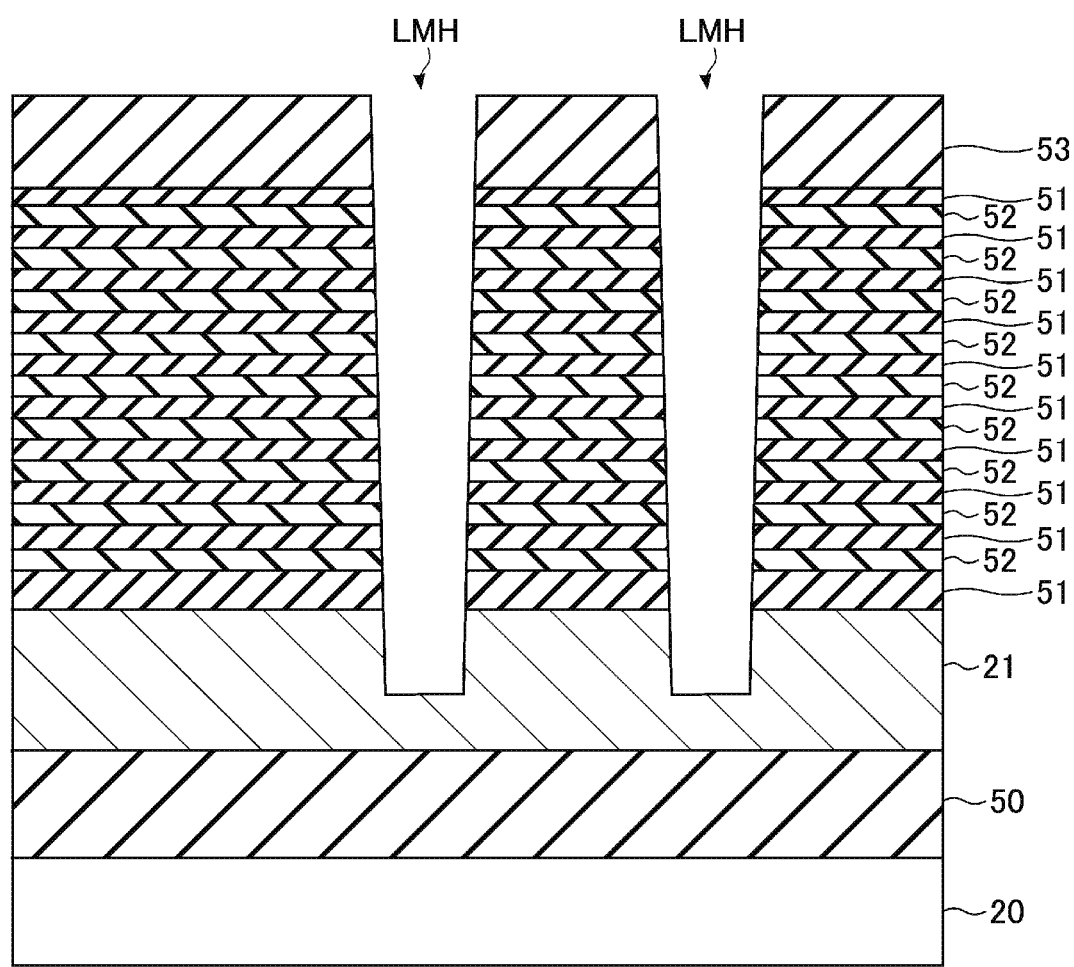

Next, as illustrated in FIG. 6, a lower memory hole LMH corresponding to the lower pillar LMP and the joint portion JT is formed. Specifically, a mask including an opening corresponding to the lower memory hole LMH is first formed by photolithography or the like. Then, the lower memory hole LMH is formed by anisotropic etching using the formed mask.

The lower memory hole LMH formed in the process passes through the insulator layers 53 and 51 and the sacrificial materials 52, and the bottom thereof reaches the conductor layer 21. The anisotropic etching in the process is, for example, reactive ion etching (RIE).

Figure 7:
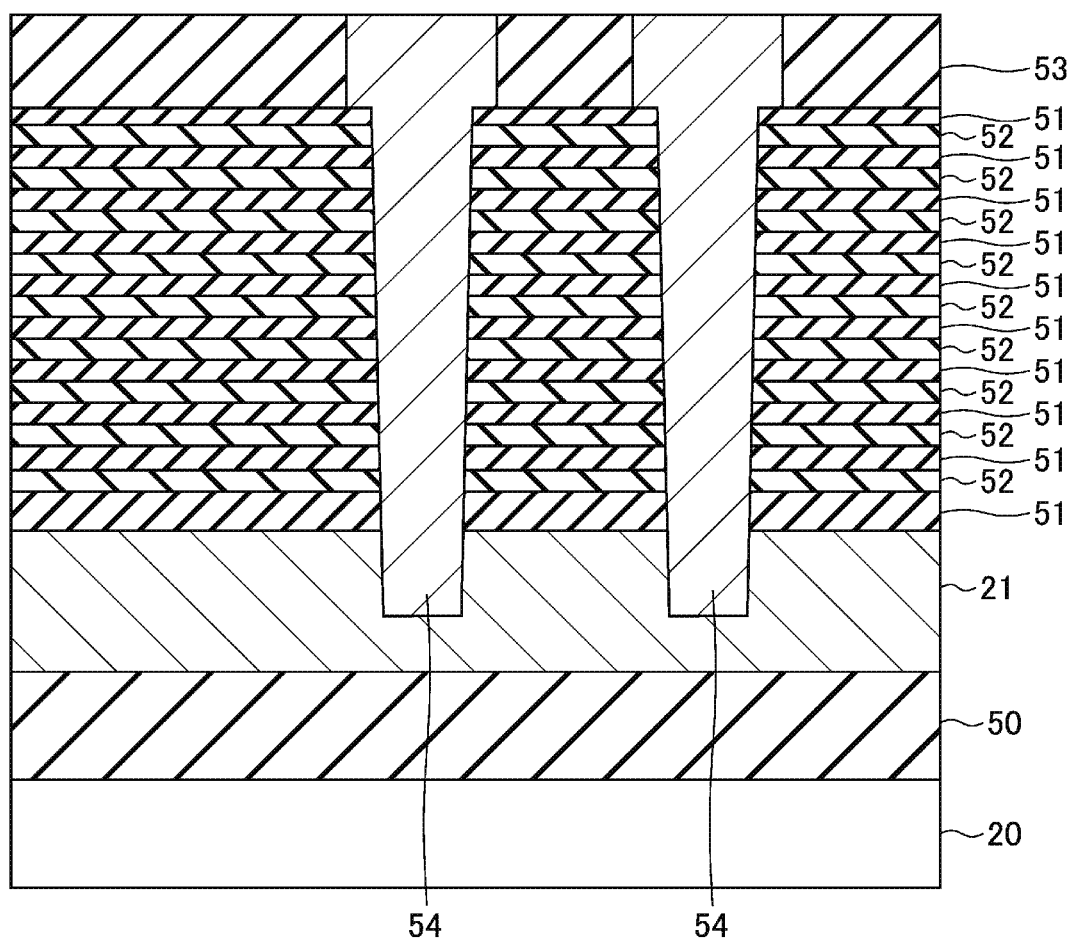

Next, as illustrated in FIG. 7, a region where the joint portion JT is formed is further formed in the lower memory hole LMH, and then a sacrificial material 54 is buried. The sacrificial material 54 includes, for example, amorphous silicon.

Specifically, first, the sacrificial material 54 is buried in the lower memory hole LMH, and then the sacrificial material 54 is etched back to a depth at which the joint portion JT is to be formed. Subsequently, after a mask (not separately illustrated) is provided on the upper surface of the insulator layer 53, wet etching that can selectively remove the insulator layer 53 is performed. Thus, the insulator layer 53 is etched in the lateral direction from the portion exposed by etching back the sacrificial material 54. Therefore, the diameter of the opening of the lower memory hole LMH is widened, and a hole having a shape corresponding to the joint portion JT is formed. Subsequently, the sacrificial material 54 is buried again in the hole having a shape corresponding to the joint portion JT.

Figure 8:
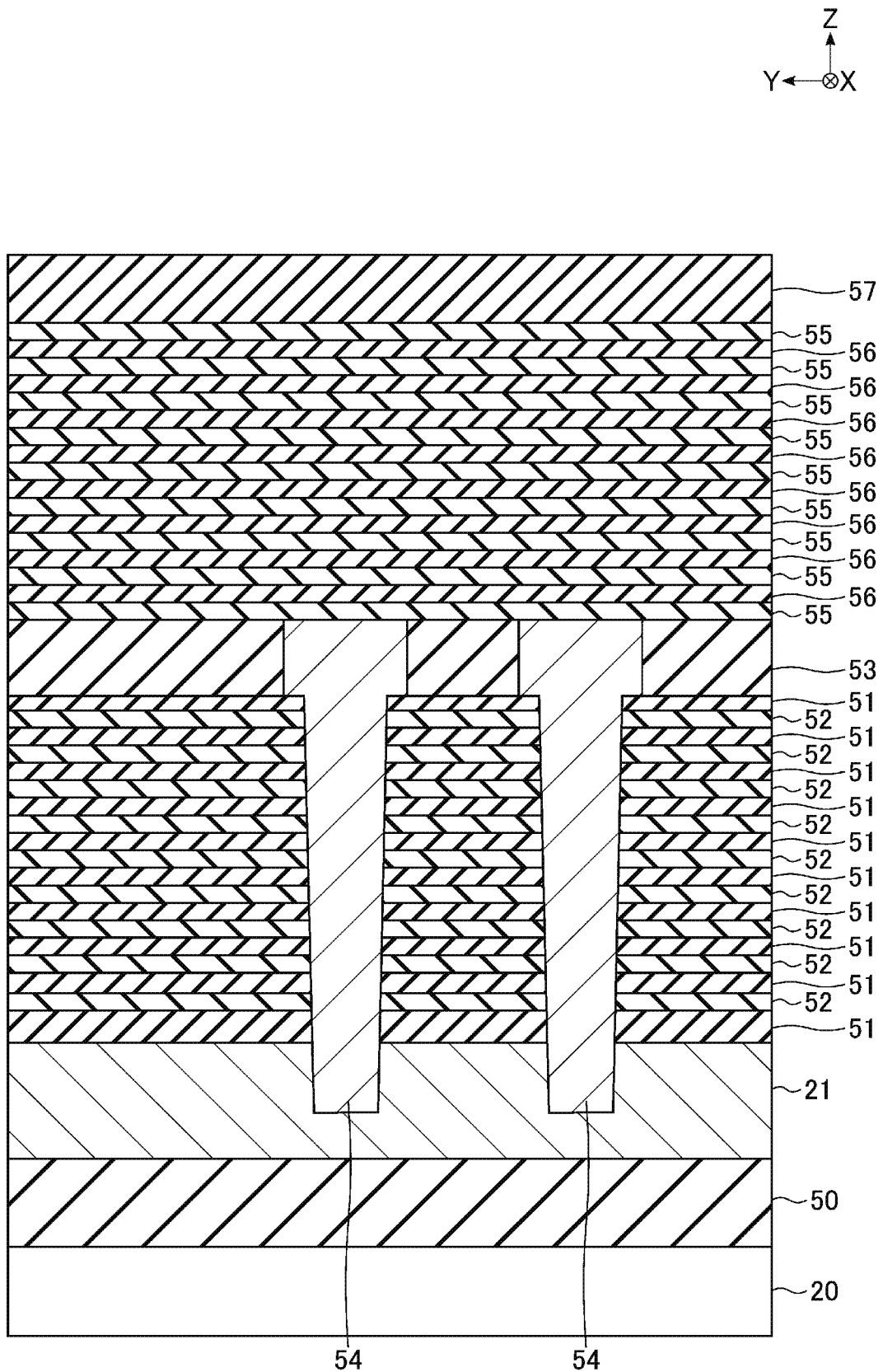

Next, as illustrated in FIG. 8, a plurality of sacrificial materials 55 corresponding to the word lines WL8 to WL15 and the select gate line SGD are stacked. Specifically, a sacrificial material 55 is first stacked on the insulator layer 53 and the sacrificial material 54. On the sacrificial material 55, the insulator layers 56 and the sacrificial materials 55 are alternately stacked a plurality of times. Then, an insulator layer 57 is further stacked on the uppermost sacrificial material 55.

The sacrificial material 55 includes, for example, silicon nitride (SiN), and the insulator layers 56 and 57 include, for example, silicon oxide ($SiO_2$). The number of layers of which the sacrificial materials 55 are formed corresponds to the number of word lines WL of the upper pillar UMP and select gate line SGD to be stacked.

Figure 9:
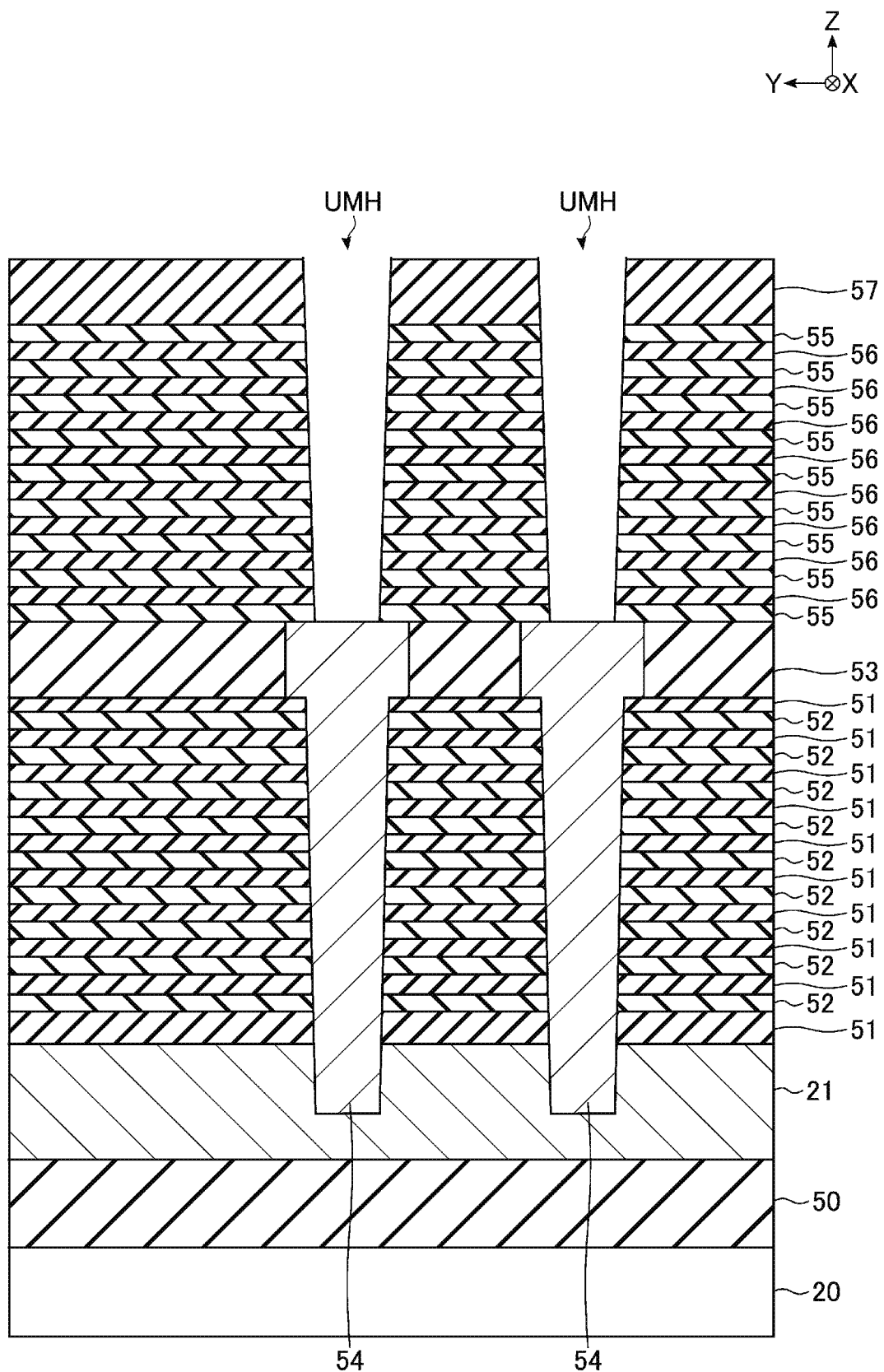

Next, as illustrated in FIG. 9, an upper memory hole UMH corresponding to the upper pillar UMP is formed. Specifically, a mask including an opening corresponding to the upper memory hole UMH is first formed by photolithography or the like. Then, the upper memory hole UMH is formed by anisotropic etching using the formed mask.

The upper memory hole UMH formed in the process passes through the insulator layers 57 and 56 and the sacrificial materials 55, and the bottom thereof reaches the sacrificial material 54. As a result, the sacrificial material 54 is exposed at the lower end of the upper memory hole UMH. The anisotropic etching in the process is, for example, RIE.

Figure 10:
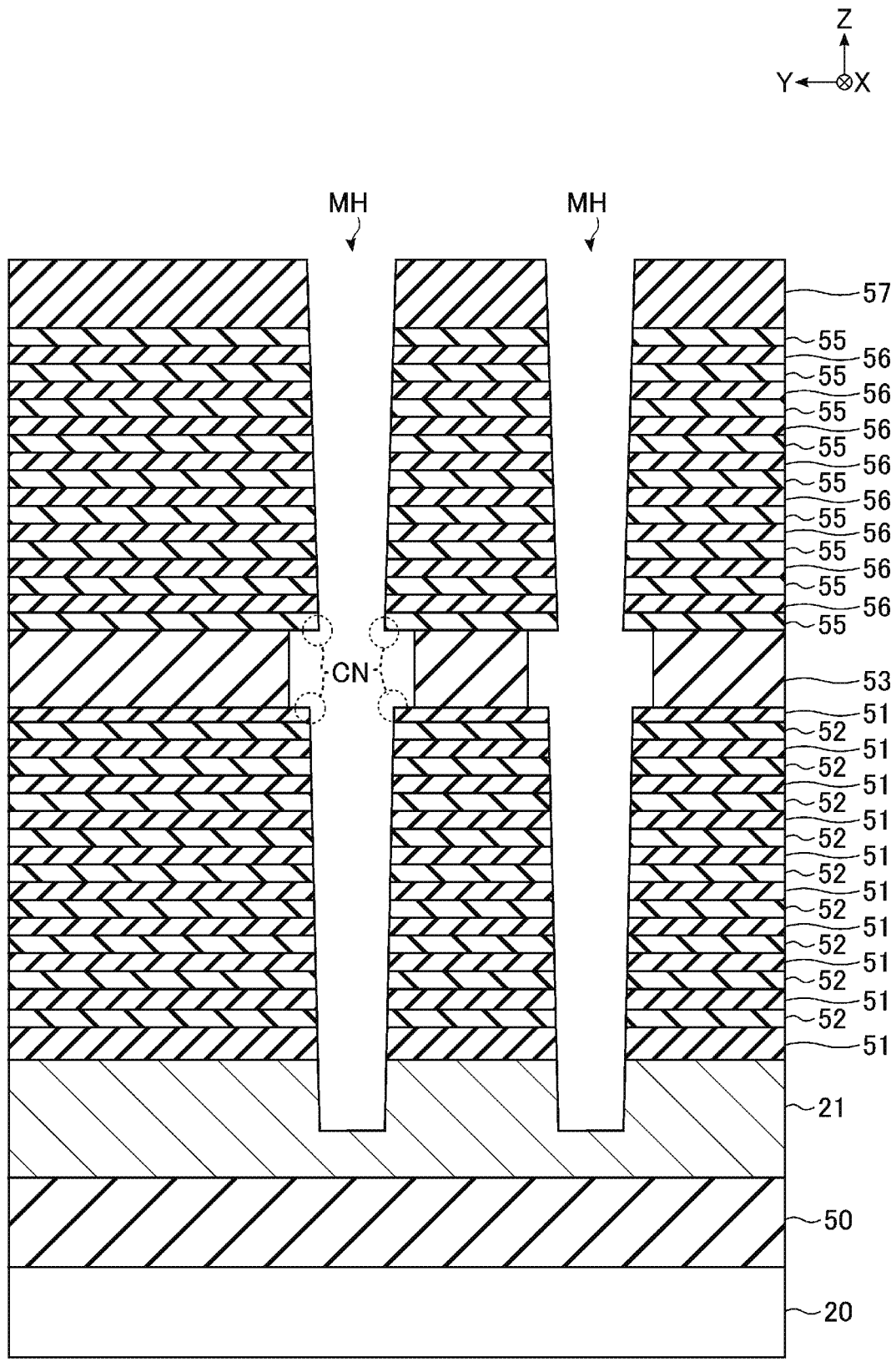

Next, as illustrated in FIG. 10, the sacrificial material 54 exposed in the upper memory hole UMH is selectively removed by, for example, wet etching. As a result, a memory hole MH reaching the conductor layer 21 from the insulator layer 57 is formed. In the memory hole MH, a corner portion is formed at the intersection of the side surface and the upper surface of the uppermost insulator layer 51 and a corner portion is formed at the intersection of the side surface and the lower surface of the lowermost sacrificial material 55 (in FIG. 10, these corner portions are each labeled and referred to as a convex portion CN).

Figure 11:
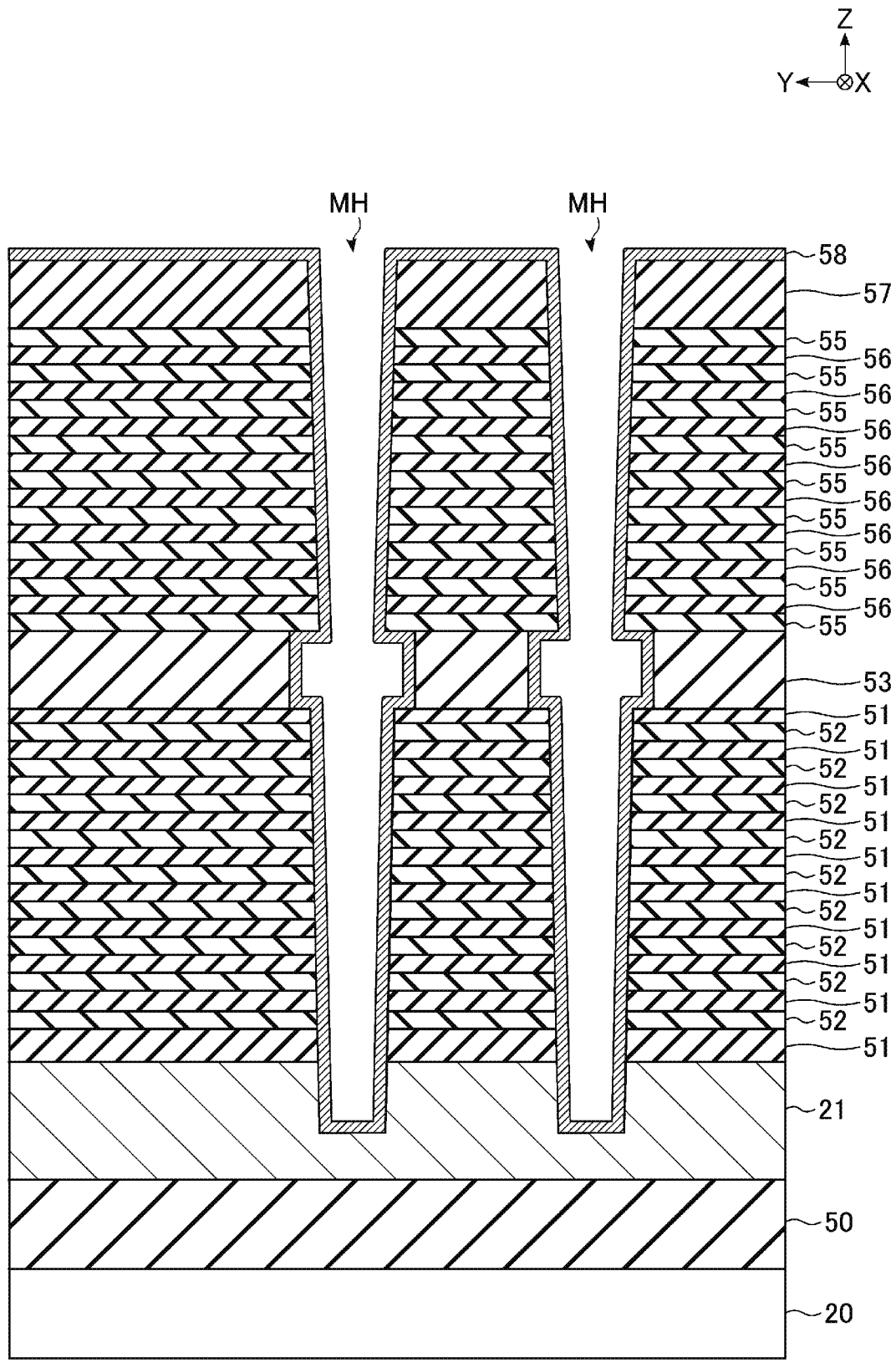

Next, as illustrated in FIG. 11, a sacrificial material 58 is formed over the entire surface. The sacrificial material 58 includes, for example, amorphous silicon. As a result, the upper surface of the insulator layer 57 and the inside of the memory hole MH are masked by the uniform sacrificial material 58 film. For example, chemical vapor deposition (CVD) is used in the process.

Figure 12:
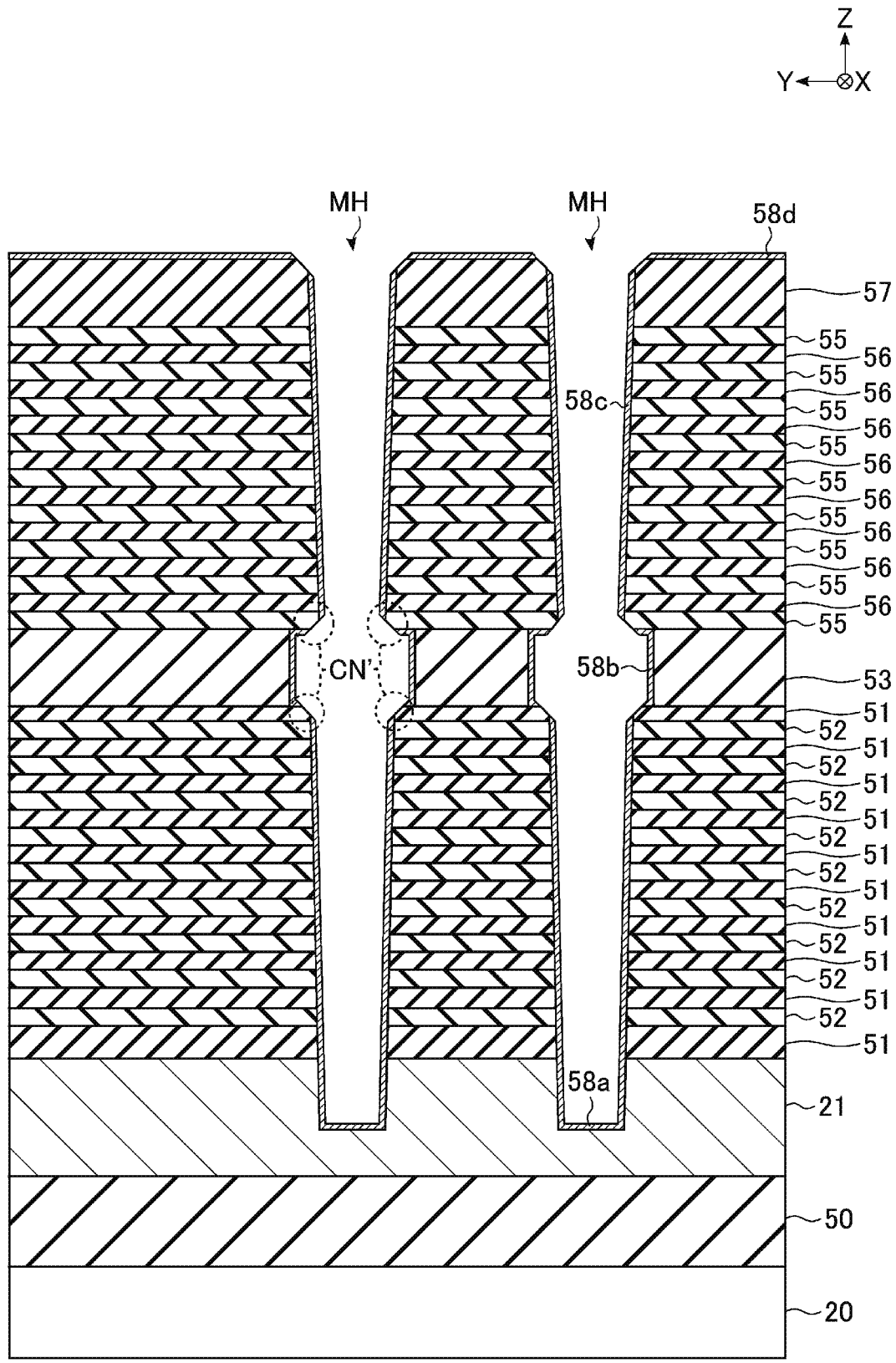

Next, as illustrated in FIG. 12, a part of the sacrificial material 58 is removed over the entire surface by slimming the sacrificial material 58 by isotropic etching. Here, the sacrificial material 58 at a convex portion CN in the memory hole MH is more easily etched than the sacrificial material 58 formed at positions (e.g., on a flat surface) other than at the convex portion CN). Therefore, while the sacrificial material 58 has been thinned at the portions other than a convex portion CN, the sacrificial material 58 is completely removed at the convex portion(s) CN, and the uppermost insulator layer 51 or the lowermost sacrificial material 55 at a convex portion CN will be partially etched/removed. Thus, in the memory hole MH, a portion CN' including a surface that exposes the uppermost insulator layer 51 and the lowermost sacrificial material 58 and includes an oblique surface that intersects both the XY plane and the Z axis is formed.

Accordingly, the sacrificial material 58 is divided (separated) into four portions: a portion 58*a* formed below the insulator layer 53, a portion 58*b* formed on the insulator layer 53, and a portion 58*c* formed above the insulator layer 53 in the memory hole MH, and a portion 58*d* formed on the upper surface of the insulator layer 57 outside the memory hole MH.

Figure 13:
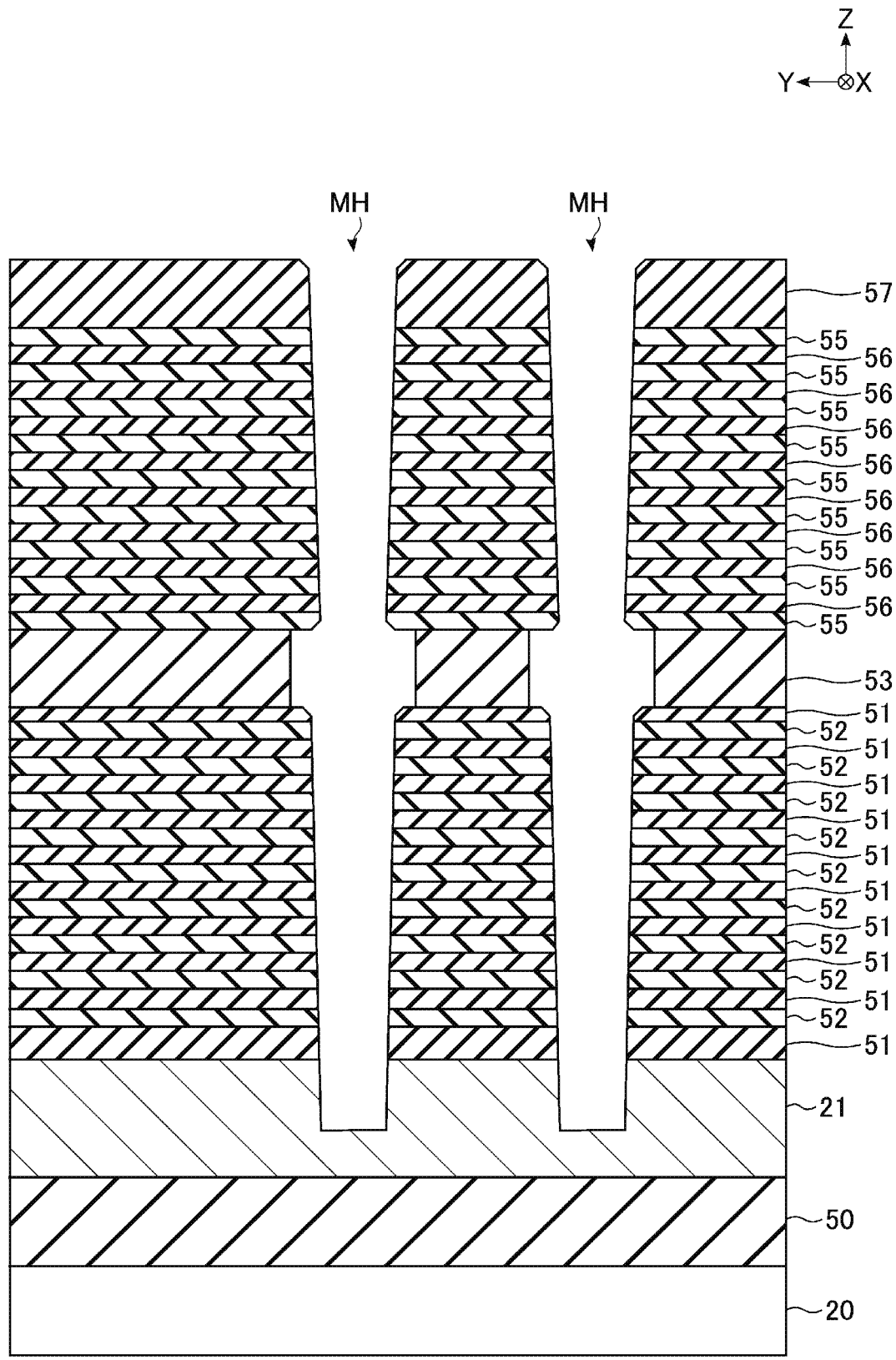

Next, as illustrated in FIG. 13, the portions 58*a* to 58*d* of the sacrificial material 58 remaining after the above-described slimming are selectively removed. As a result, in the memory hole MH, the sacrificial materials 52 and 55 and the like are now exposed in the portions o outside the portions CN'. The selective removal in the process is, for example, a wet etching that can selectively remove silicon.

Figure 14:
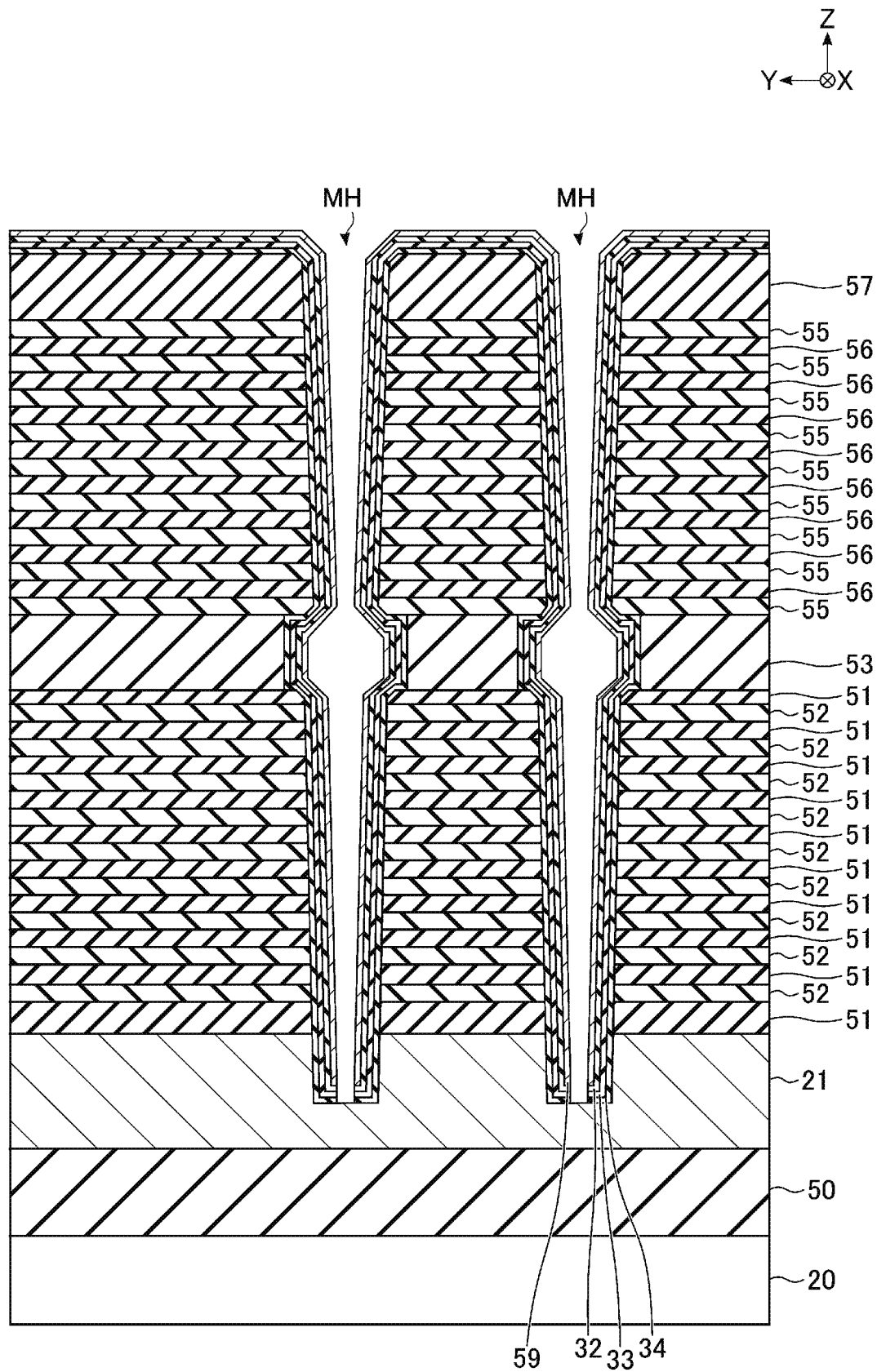

Next, as illustrated in FIG. 14, the block insulating film 34, the charge storage layer 33, the tunnel insulating film 32, and a sacrificial material 59 are stacked in order. For example, CVD is used in the process. The sacrificial material 59 includes, for example, amorphous silicon. Thereafter, the bottom of the memory hole MH is removed by anisotropic etching, and the conductor layer 21 is exposed. The anisotropic etching in the process is, for example, RIE. The sacrificial material 59 has a function of protecting the stacked films from etching when the bottom of the memory hole MH is etched.

Figure 15:
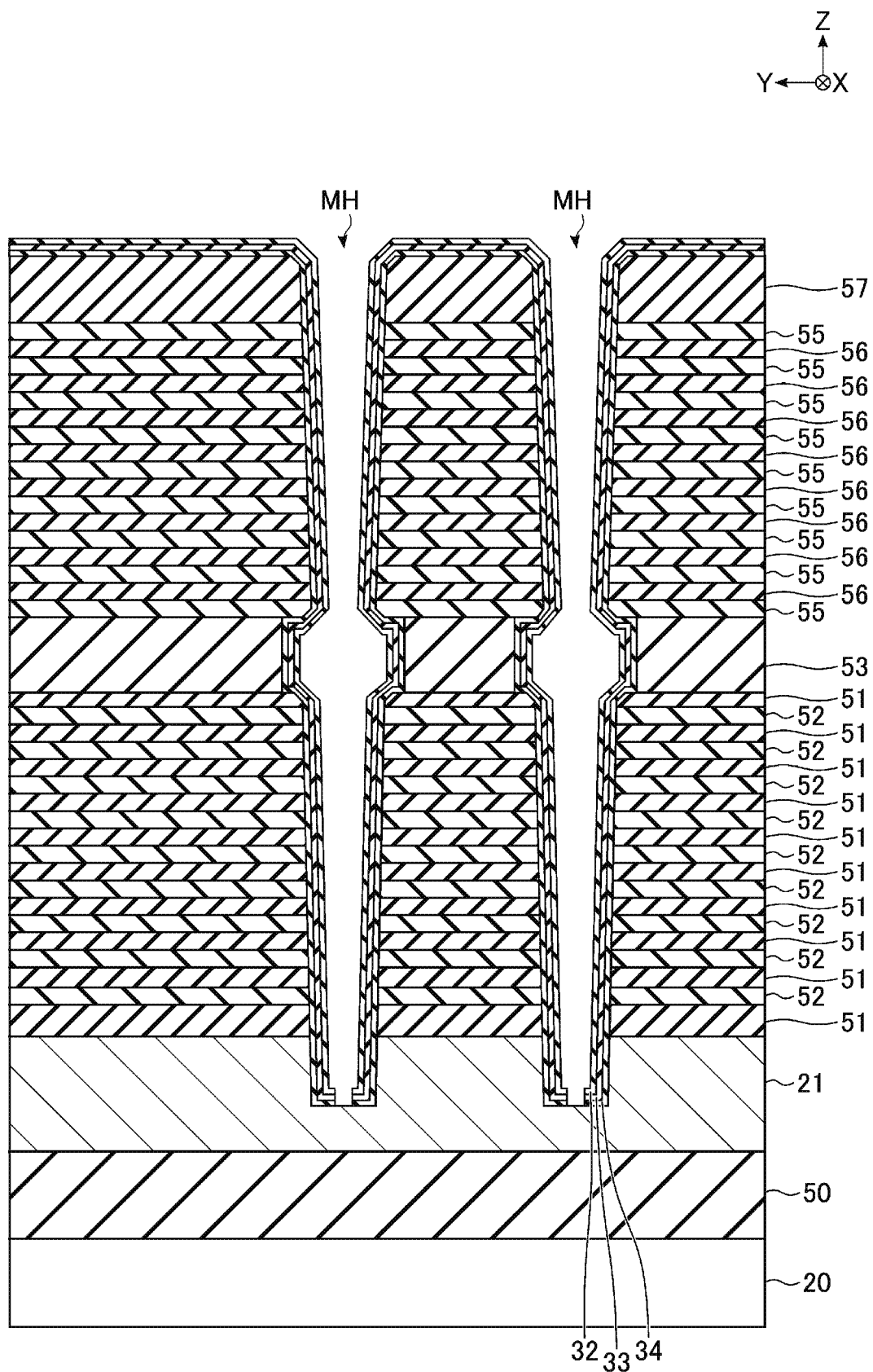

Next, as illustrated in FIG. 15, the sacrificial material 59 is selectively removed, and the tunnel insulating film 32 is exposed. The removal in the process is, for example, wet etching that can selectively remove silicon.

Figure 16:
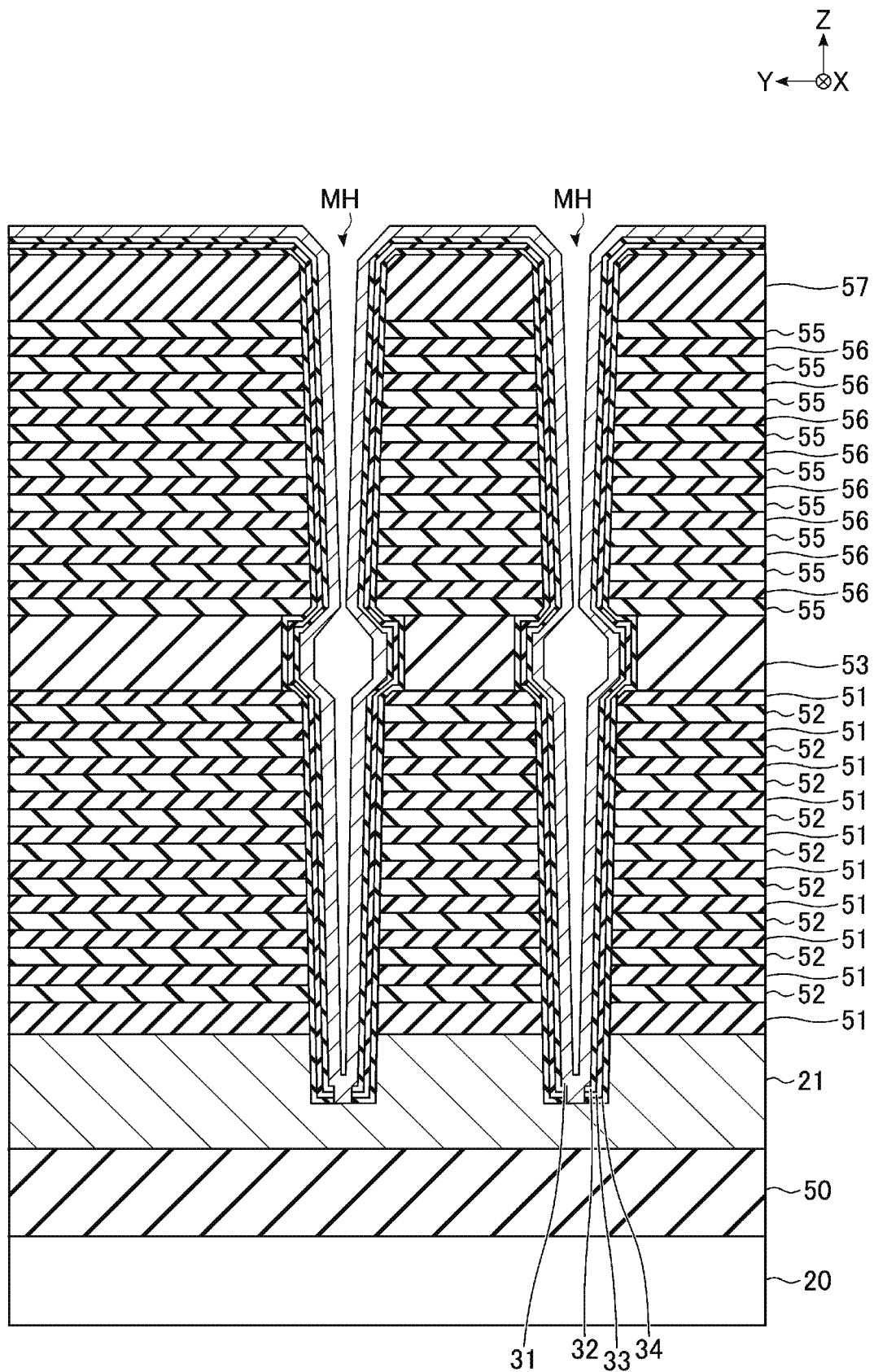

Next, as illustrated in FIG. 16, the semiconductor layer 31 is formed to cover the tunnel insulating film 32, and the semiconductor layer 31 is brought into contact with the conductor layer 21. For example, CVD is used in the process. The semiconductor layer 31 includes, for example, amorphous silicon. Thereafter, the semiconductor layer 31 is heated by annealing to change from an amorphous state to a crystalline state. In order to increase the grain size of the crystalline semiconductor layer 31, it is preferable that the semiconductor layer 31 be formed as thick as possible in the process.

Figure 17:
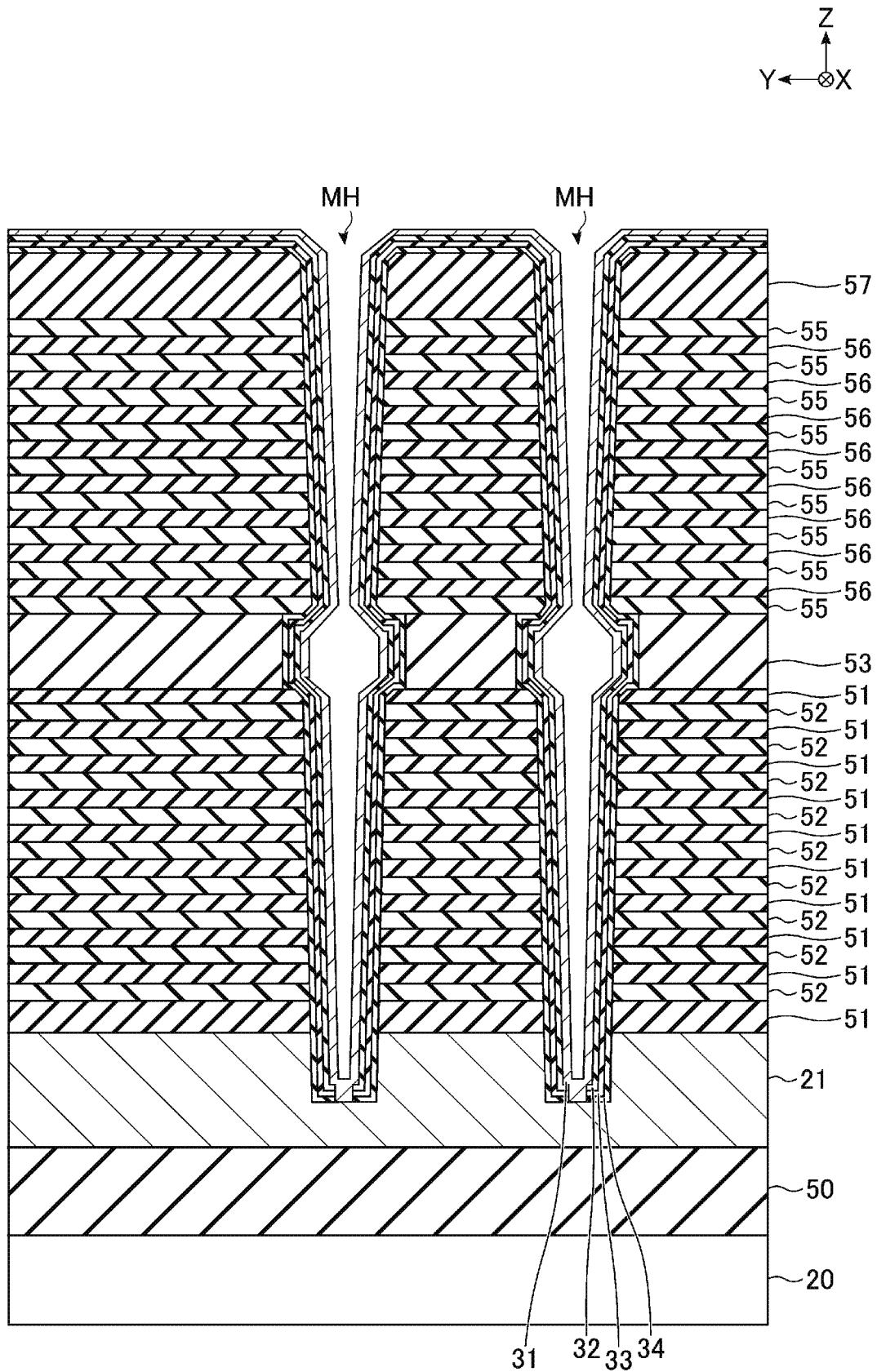

Next, as illustrated in FIG. 17, the crystallized semiconductor layer 31 is slimmed by isotropic etching to remove a part of the semiconductor layer 31 over the entire surface. The slimming in the process is executed, for example, under the same conditions as the slimming described in FIG. 12. Unlike the case described with reference to FIG. 12, the convex portion CN in the memory hole MH is already etched into a portion CN' including an oblique surface. Therefore, the etching rate in the portion CN' is equal to the portion other than the portion CN', and the semiconductor layer 31 is etched so that the film thickness is substantially uniform between the portion CN' and the other portions.

Figure 18:
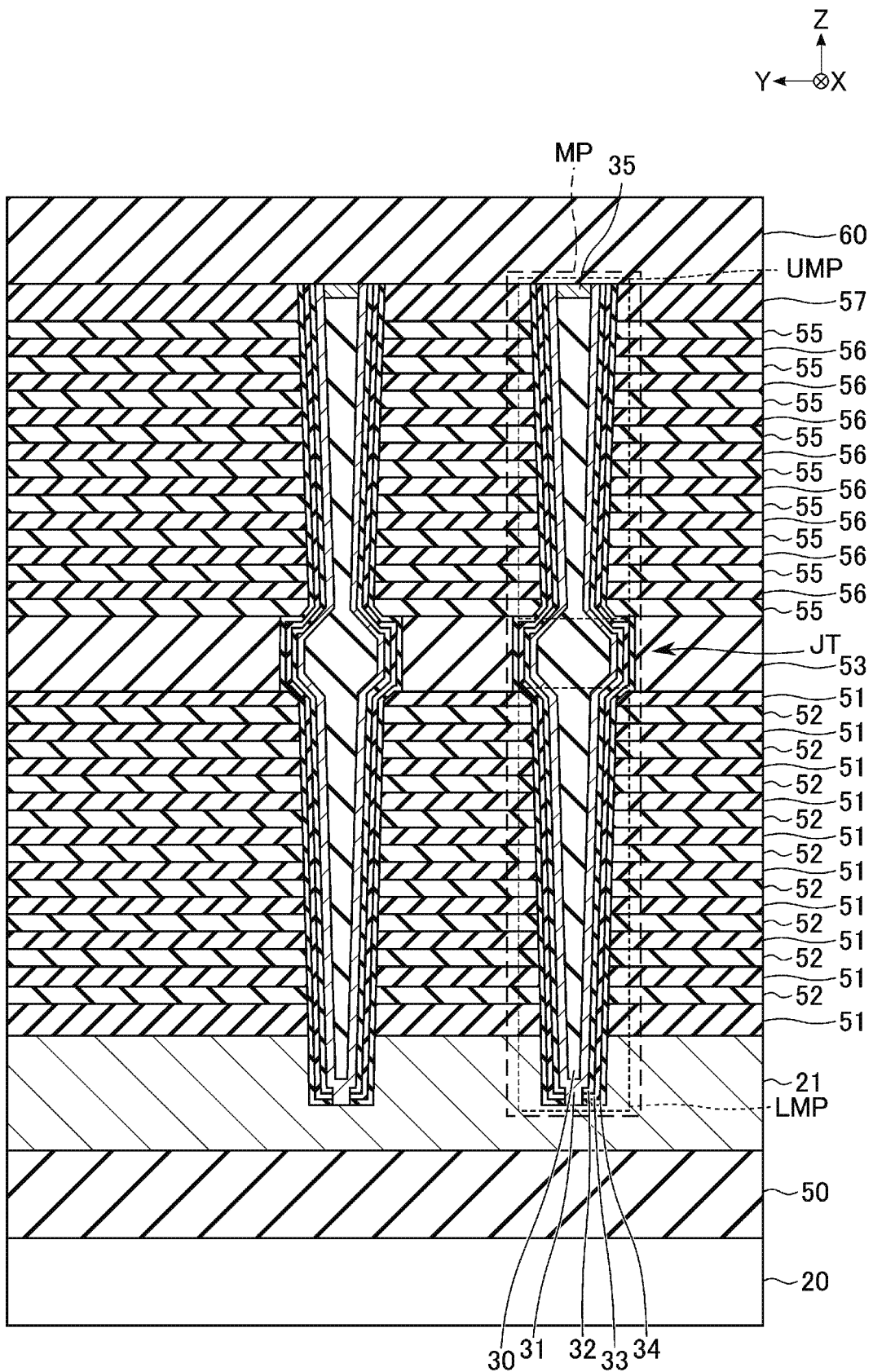

Next, as illustrated in FIG. 18, the block insulating film 34, the charge storage layer 33, the tunnel insulating film 32, the semiconductor layer 31 and the core member 30 remaining above the insulator layer 57 are removed after the memory hole MH is buried by the core member 30. For example, chemical mechanical polishing (CMP) is used in the process. Then, a part of the core member 30 formed above the memory hole MH is further removed, and the semiconductor portion 35 is buried in the space. As a result, the memory pillar MP is formed. An insulator layer 60 is formed on the upper surfaces of the insulator layer 57 and the memory pillar MP.

Figure 19:
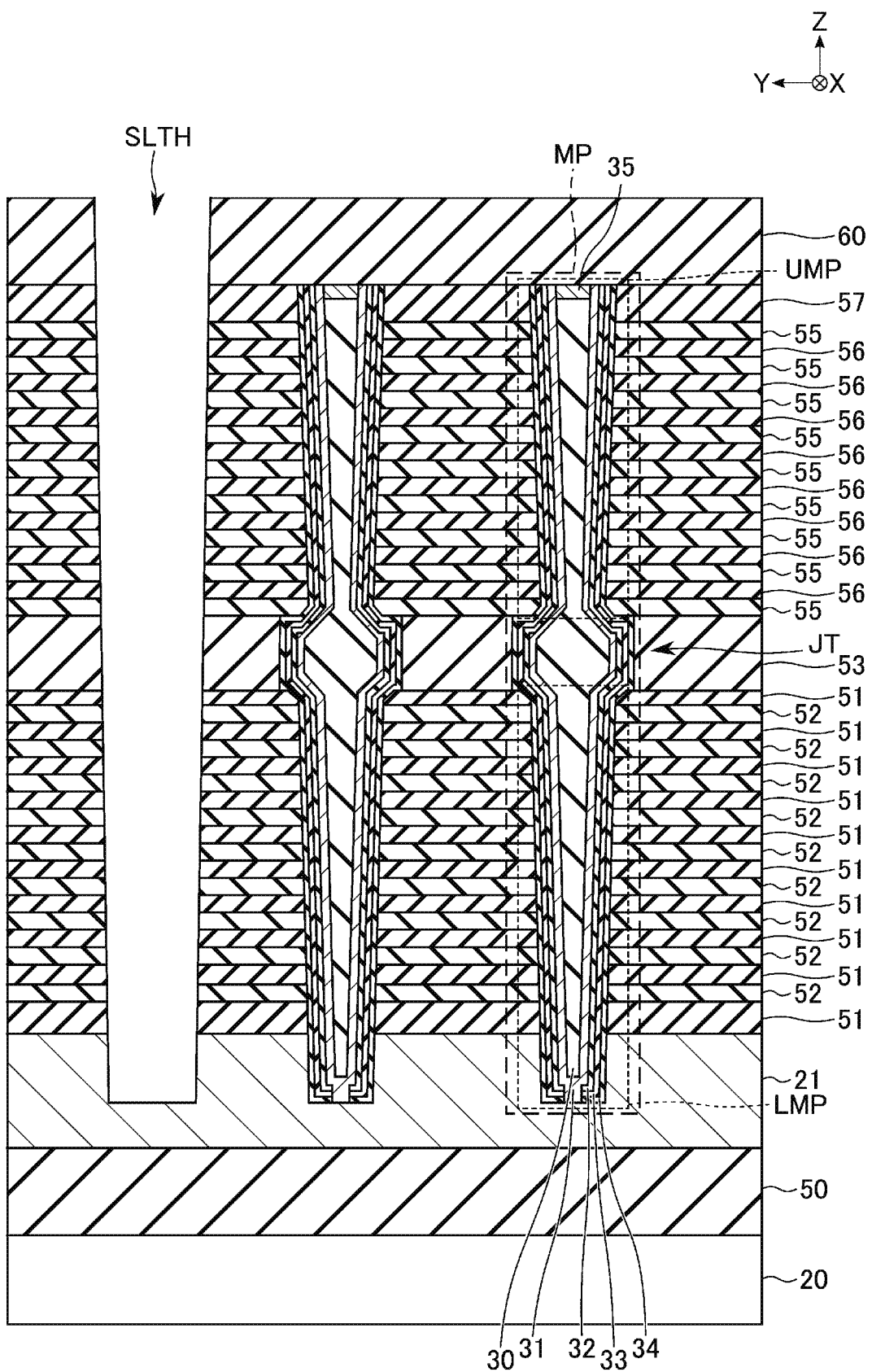

Next, as illustrated in FIG. 19, a hole SLTH corresponding to the slit SLT is formed. Specifically, a mask including an opening corresponding to the hole SLTH is first formed by photolithography or the like. Then, the hole SLTH is formed by anisotropic etching using the formed mask.

The hole SLTH formed in the process divides each of the insulator layers 51, 53, 56, 57, and 60 and the sacrificial materials 52 and 55, and the bottom thereof reaches, for example, the conductor layer 21. It is sufficient that the bottom of the hole SLTH reaches at least the layer on which the conductor layer 21 is formed. The anisotropic etching in the process is, for example, RIE.

Next, the replacement process of the sacrificial material 52 to the select gate line SGS and the word lines WL0 to WL7 and the replacement process of the sacrificial material 55 to the word lines WL8 to WL15 and the select gate line SGD are simultaneously performed. Specifically, first, the surface of the conductor layer 21 exposed in the hole SLTH is oxidized to form an oxidation protection film (not separately illustrated). Thereafter, the sacrificial materials 52 and 55 are selectively removed by wet etching using, for example, hot phosphoric acid. The three-dimensional structure of the structure body from which the sacrificial materials 52 and 55 are removed is maintained by a plurality of memory pillars MP and the like.

Figure 20:
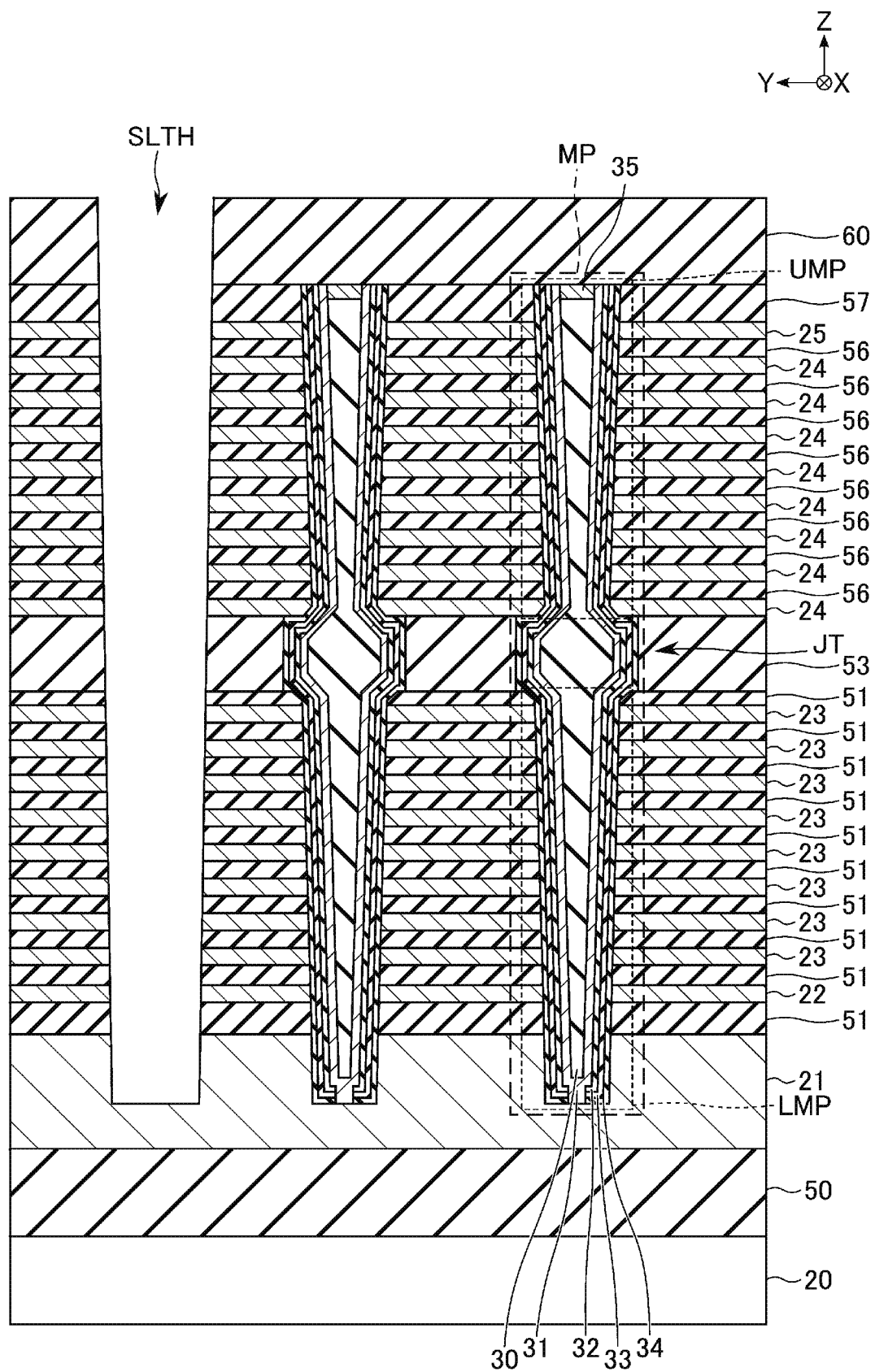

Then, as illustrated in FIG. 20, a conductor is buried through the hole SLTH in the space from which the sacrificial materials 52 and 55 are removed. For example, CVD is used in the process. Of the conductor, portions formed inside the hole SLTH and on the upper surface of the insulator layer 60 are removed by an etching-back process. As a result, the conductors formed in the adjacent wiring layers are separated, and the conductor layer 22 corresponding to the select gate line SGS, each of the plurality of conductor layers 23 respectively corresponding to the word lines WL0 to WL7, a plurality of conductor layers 24 respectively corresponding to the lines WL8 to WL15, and the conductor layer 25 corresponding to the select gate line SGD are formed. The conductor layers 22 to 25 formed in the process may contain a barrier metal. Here, in the formation of the conductor after the removal of the sacrificial materials 52 and 55, for example, after a film is formed with titanium nitride (TiN) as a barrier metal, tungsten (W) is formed.

Figure 21:
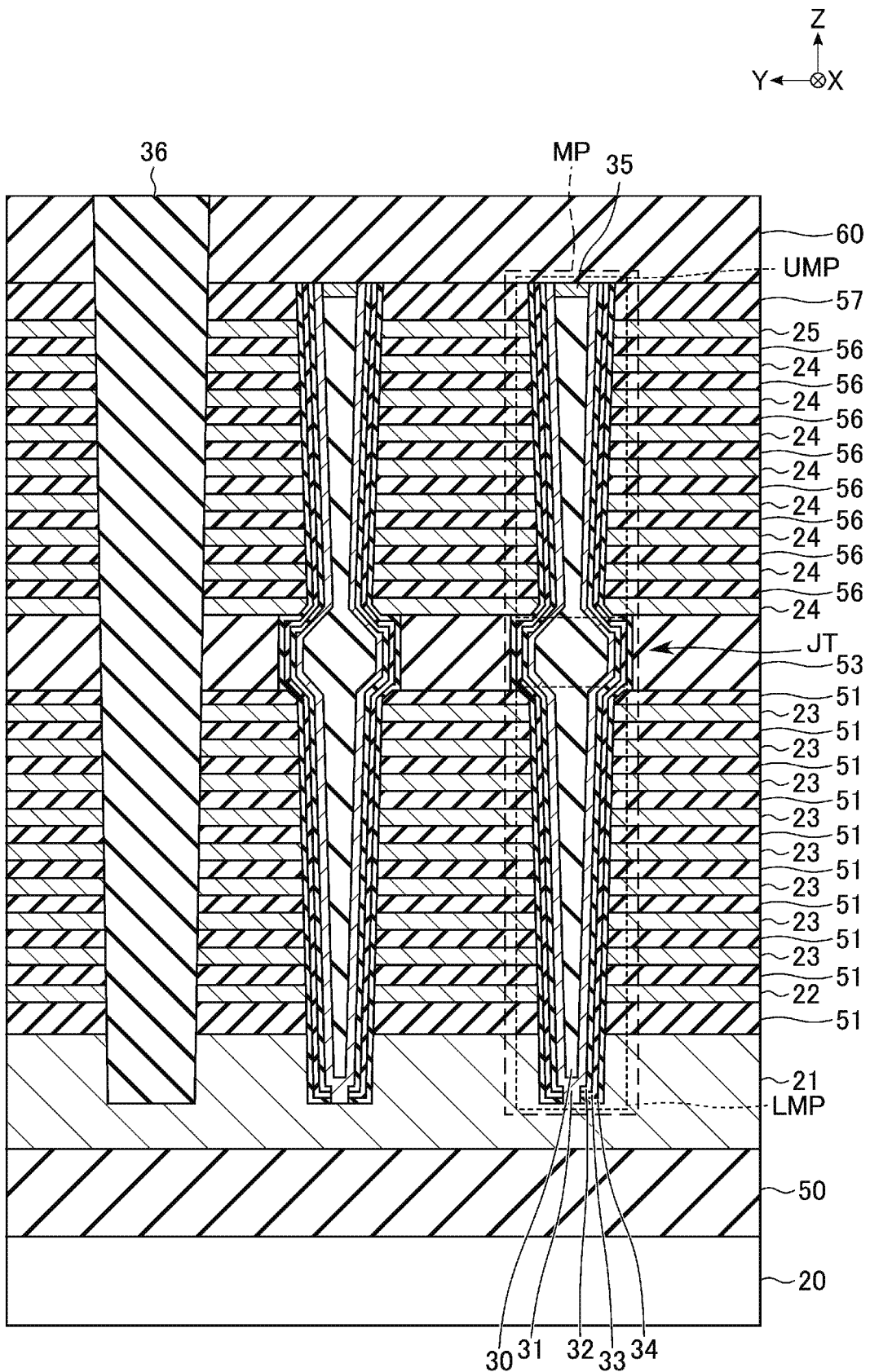

Next, as illustrated in FIG. 21, an insulator layer 36 corresponding to the slit SLT is formed in the hole SLTH. Specifically, the insulator layer 36 is formed on the insulator layer 60 to fill the hole SLTH. Then, the insulator layer 36 formed above the insulator layer 60 is removed by CMP, for example.

Through the manufacturing processes of the semiconductor memory device according to the first embodiment described above, the memory pillar MP; and the source line SL, the word lines WL, and the select gate lines SGS and SGD connected to the memory pillar MP are formed respectively. The manufacturing process described above is merely an example, and another process may be inserted between depicted/described manufacturing processes, and likewise the order of the manufacturing processes may be altered in certain instances.

1.3 Effects According to the Embodiment

According to the first embodiment, the semiconductor layers in the memory pillar can be connected well. The effect will be described below.

The memory pillar MP includes the joint portion JT including portions JTa, JTb, and JTc, the upper pillar UMP including portions UMPa and UMPb, and the lower pillar LMP including portions LMPa and LMPb. The joint portion JT is connected to the upper pillar UMP via the boundary IFu, and is connected to the lower pillar LMP via the boundary IFd. The portion JTa extends along the Z axis between the uppermost conductor layer 23 and the lowermost conductor layer 24, the portion JTb extends in the layered surface of the conductor layers 23 and 24 above the portion JTa, and the portion JTc extends in the layered surface below the portion JTa. The diameter of the portion UMPa decreases in the upward direction from the portion JTb, and the diameter of the portion LMPa decreases more than the portion LMPb in the downward direction from the portion JTc. Thus, it is possible to prevent the semiconductor layer 31 from being divided along the Z axis at the boundaries IFu and IFd.

As described with reference to FIGS. 10 to 13, the convex portion CN existing in the memory hole MH immediately after the formation is removed by slimming using the sacrificial material 59 to shape a corner portion CN' having a rounded shape. The convex portion CN has a higher etching rate during slimming than other portions, while the portion CN' has the same etching rate during slimming as compared to other portions. Therefore, as described with reference to FIGS. 16 and 17, the etching rate for the semiconductor layer 31 can be made uniform regardless of the location inside the memory pillar MP during slimming performed in the formation of the semiconductor layer 31. Therefore, it is possible to reduce the film thickness of the semiconductor layer 31 while preventing the semiconductor layer 31 from being divided along the Z axis, and as a result, it is possible to excellently connect the current path in the memory pillar MP.

By the above-described slimming, the minimum value of the diameter of the upper pillar UMP is located above the boundary IFu with the joint portion JT. Thus, the minimum value of the diameter of the memory hole MH can be made larger than when the minimum value of the diameter of the upper pillar UMP is located at the boundary IFu with the joint portion JT. Therefore, when the conductor layer 21 is exposed by etching the bottom of the memory hole MH, the opening area can be increased, and as a result, the contact between the semiconductor layer 31 and the conductor layer 21 can be improved. Therefore, the current path in the memory pillar MP can be connected well.

The lowermost conductor layer 24 is formed by replacing the sacrificial material 55 in which the convex portion CN is removed to become the portion CN' during the above-described slimming. Therefore, the memory cell transistor MT8 that causes the lowermost conductor layer 24 to function as a gate has a shape that is more easily turned on than the case when the convex portion CN is provided. Therefore, the parasitic resistance of the lowermost memory cell transistor MT in the upper pillar UMP can be reduced, and as a result, the read current flowing in the memory pillar MP can be reduced.

2. Second Embodiment

The semiconductor memory device according to the second embodiment is different from that of the first embodiment in that a new insulator layer is formed between the insulator layer 53 and the lowermost conductor layer 24 at a position corresponding to the joint portion JT. Hereinafter, the differences of the semiconductor memory device according to the second embodiment from that of the first embodiment will be described.

2.1 Memory Cell Array

Figure 22:
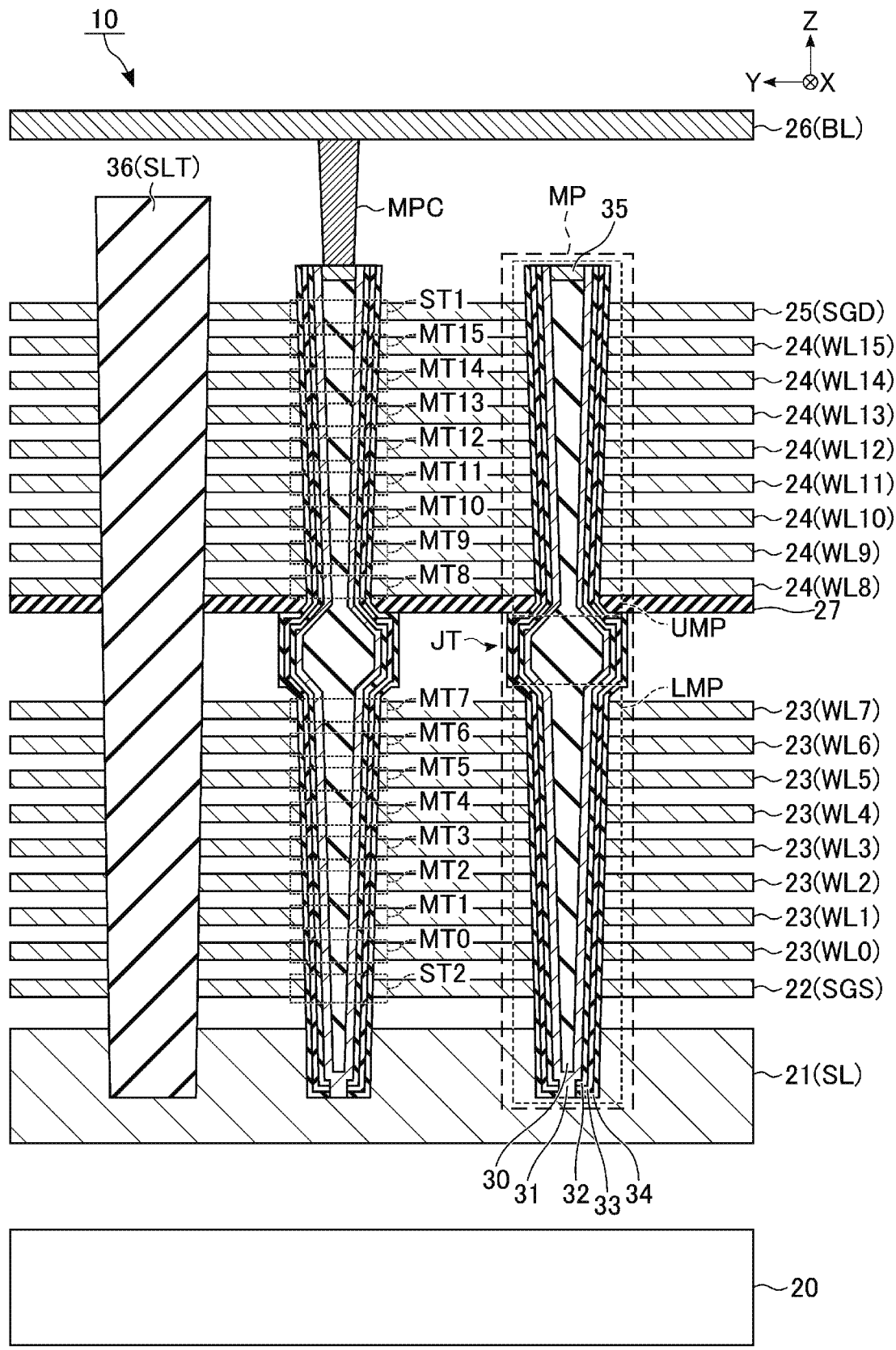
FIG. 22 is a cross-sectional view of a memory cell array of a semiconductor memory device according to a second embodiment.

FIG. 22 illustrates an example of a cross-sectional structure of the memory cell array 10 in the semiconductor memory device according to the second embodiment. As illustrated in FIG. 22, the structure of the memory cell array 10 in the second embodiment has the structure of the stacked body above the joint portion JT different from the structure of the memory cell array 10 described in the first embodiment with reference to FIG. 3. Specifically, the stacked body in the second embodiment is provided with an insulator layer 27 between an insulator layer formed in the joint portion JT and the lowermost conductor layer 24. The shape of the memory pillar MP is the same as that of the first embodiment.

Figure 23:
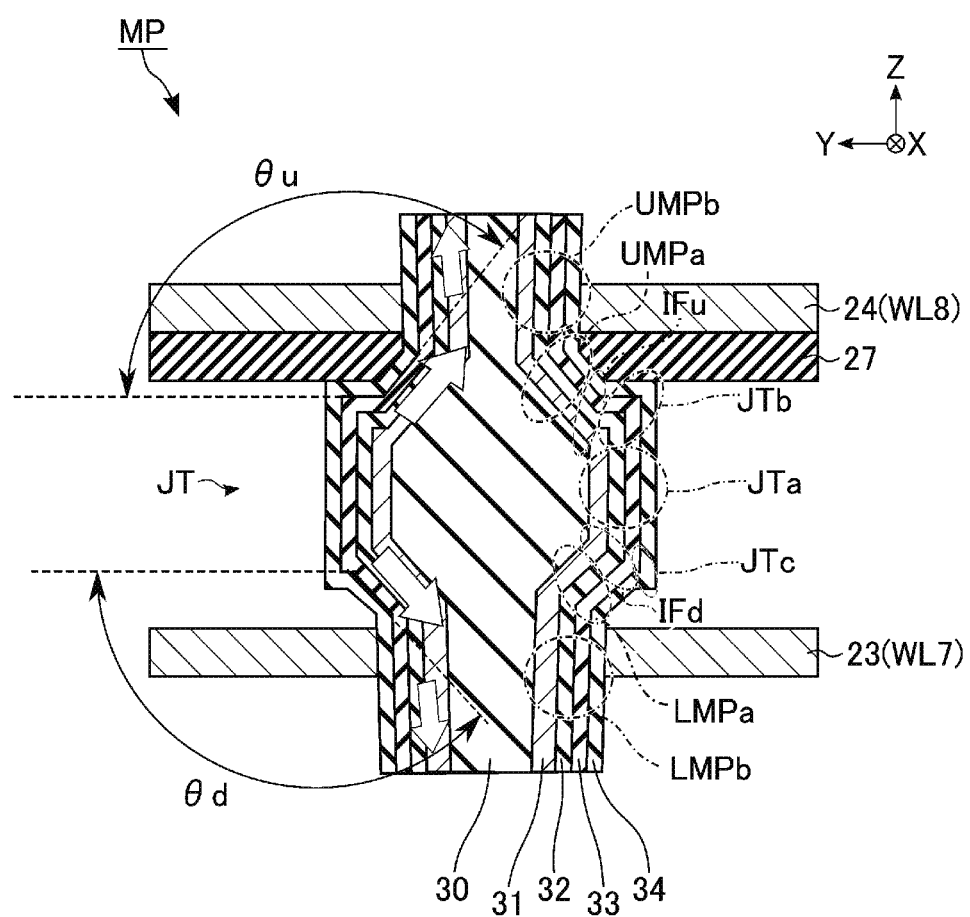
FIG. 23 is a cross-sectional view of a portion including a joint portion in a memory pillar of a semiconductor memory device.

FIG. 23 is an enlarged view of a cross-sectional structure of a portion including the joint portion JT in the memory pillar MP illustrated in FIG. 22.

In the portion JTb, the block insulating film 34 may be connected to the insulator layer 27 and provided above the charge storage layer 33 along the Z axis, and the charge storage layer 33 may be provided above the tunnel insulating film 32 along the Z axis. The tunnel insulating film 32 may be provided above the semiconductor layer 31 along the Z axis. The portion JTb is located at the upper end of the joint portion JT and is connected to the portion UMPa of the upper pillar UMP via the boundary IFu.

The insulator layer 27 is in contact with the block insulating film 34 in the portion JTb and the block insulating film 34 in the portion UMPa. The insulator layer 27 may be also in contact with the block insulating film 34 in the portion UMPb. Therefore, the area of the portion of the insulator layer 27 parallel to the layered surface is smaller on the lower surface than on the upper surface.

On the other hand, the lowermost conductor layer 24 is mainly contacted to the block insulating film 34 in the portion UMPb. Therefore, the area of the portion parallel to the layered surface in the lowermost conductor layer 24 is substantially the same on the upper surface and the lower surface as in the other conductor layers 24.

2.2 Effects According to the Second Embodiment

In the second embodiment, the insulator layer 27 is provided between the insulator layer 53 and the lowermost conductor layer 24. Thus, the lowermost conductor layer 24 has a shape mainly contacted to the block insulating film 34 in the portion UMPb, similarly to the other conductor layers 24. Therefore, it is possible to prevent the lowermost conductor layer 24 from having a shape different from the other conductor layers 24, and thus differences in characteristics between the different memory cell transistors MT can be reduced.

The memory pillar MP in the second embodiment has the same configuration as the memory pillar MP in the first embodiment. Therefore, the configuration in the second embodiment can have an effect equivalent to the configuration in the first embodiment.

3. Third Embodiment

In the semiconductor memory device according to the third embodiment is different from that of the second embodiment in that the film thickness of the stacked films is thinner than the film thickness of the other portions in the connection portion between the joint portion JT and the upper pillar UMP and the connection portion between the joint portion JT and the lower pillar LMP. Hereinafter, the differences of the semiconductor memory device according to the third embodiment from that of the second embodiment will be described.

3.1 Memory Cell Array

Figure 24:
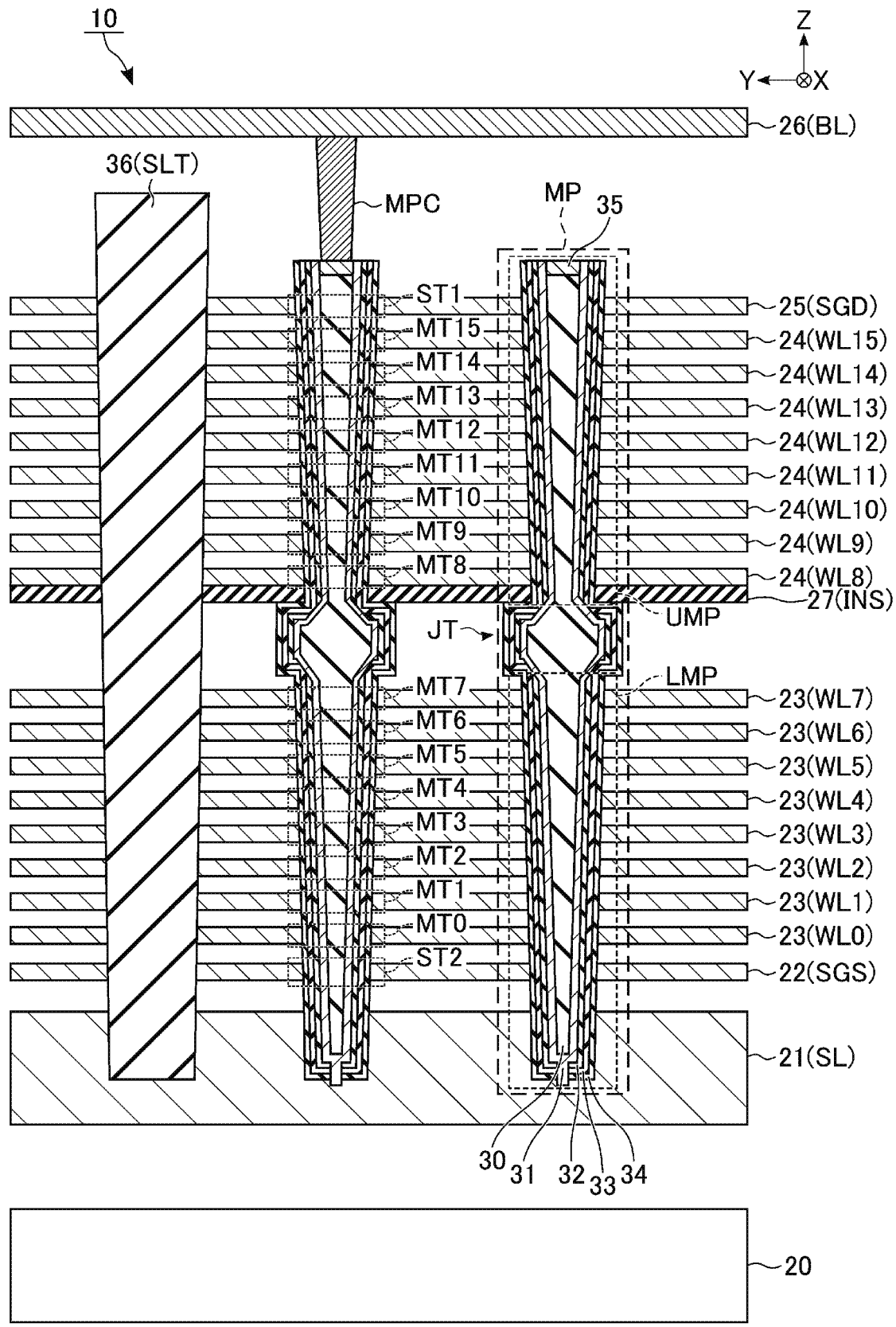
FIG. 24 is a cross-sectional view of a memory cell array of a semiconductor memory device according to a third embodiment.

FIG. 24 illustrates an example of a cross-sectional structure of the memory cell array 10 in the semiconductor memory device according to the third embodiment. As illustrated in FIG. 24, the structure of the memory cell array 10 in the third embodiment has a structure of stacked films different from the structure of the memory cell array 10 described in the second embodiment with reference to FIG. 22. Specifically, the tunnel insulating film 32 is divided into a portion 32a corresponding to the lower pillar LMP, a portion 32b corresponding to the joint portion JT, and a portion 32c corresponding to the upper pillar UMP.

Figure 25:
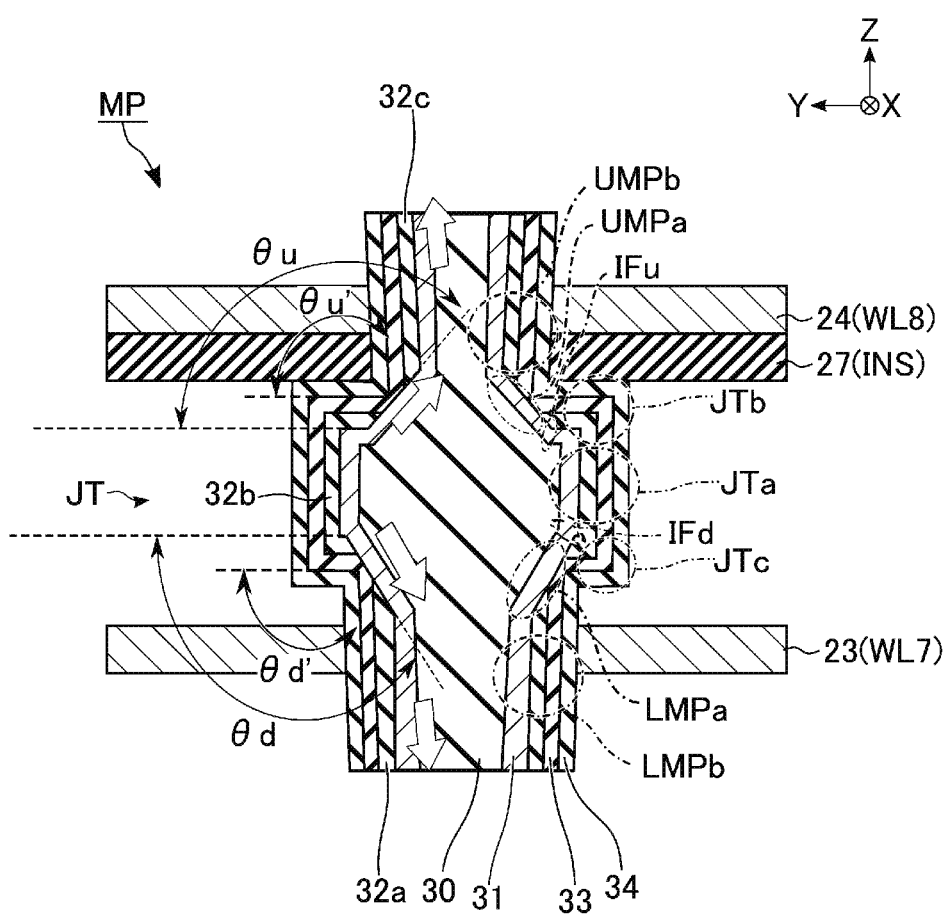
FIG. 25 is a cross-sectional view of a portion including a joint portion in a memory pillar of a semiconductor memory device.

FIG. 25 illustrates an enlarged cross-sectional structure of a portion including the joint portion JT in the memory pillar MP illustrated in FIG. 24.

As illustrated in FIG. 25, the semiconductor layer 31 and the stacked films in the joint portion JT include portions JTa, JTb, and JTc. The stacked films in the upper pillar UMP include the portion UMPb, and the semiconductor layer 31 further includes the portion UMPa in addition to the portion UMPb. The stacked films in the lower pillar LMP include the portion LMPb, and the semiconductor layer 31 further includes the portion LMPa in addition to the portion LMPb.

First, details of the configuration above the portion JTa will be described.

In the example of FIG. 25, the semiconductor layer 31, the charge storage layer 33, and the block insulating film 34 are continuous films at the connection portion between the joint portion JT and the upper pillar UMP. Among the semiconductor layer 31, the charge storage layer 33, and the block insulating film 34, only the charge storage layer 33 has a thinned film thickness at the connection portion between the joint portion JT and the upper pillar UMP.

The semiconductor layer 31 is connected from the portion JTb of the joint portion JT to the portion UMPa of the upper pillar UMP via the boundary IFu. The interface between the semiconductor layer 31 and the tunnel insulating film 32 forms an obtuse angle θu (θu>90 degrees) toward the outside of the memory pillar MP at the boundary IFu. That is, the semiconductor layer 31 in the portion UMPa extends in a direction approaching the center of the memory pillar MP as going upward from the boundary IFu. In other words, the diameter of the semiconductor layer 31 in the portion UMPa decreases in the upward direction from the boundary IFu. The semiconductor layer 31 in the portion UMPb extends in a direction away from the center of the memory pillar MP as going upward from the upper end of the portion UMPa. In other words, the diameter of the semiconductor layer 31 in the portion UMPb increases in the upward direction from the upper end of the portion UMPa. Thus, the semiconductor layer 31 of the upper pillar has a constricted shape having a minimum diameter at the boundary between the portion UMPa and the portion UMPb.

The charge storage layer 33 and the block insulating film 34 are connected from the portion JTb of the joint portion JT to the portion UMPb of the upper pillar UMP without passing through the portion UMPa. The interface between the charge storage layer 33 and the block insulating film 34 forms a right angle or an acute angle θu' (θu'≤90 degrees) toward the outside of the memory pillar MP at the connection portion between the portion JTb and the portion UMPb. That is, the charge storage layer 33 and the block insulating film 34 in the portion UMPb extend in a direction away from the center of the memory pillar MP as going upward from the connection portion between the portion JTb and the portion UMPb. In other words, the diameters of the charge storage layer 33 and the block insulating film 34 in the portion UMPb increase in the upward direction from the connection portion between the portion JTb and the portion UMPb. The diameter of the portion 32c of the tunnel insulating film 32 in the portion UMPb increases upward.

Next, details of the configuration below the portion JTa will be described.

In the example of FIG. 25, the semiconductor layer 31, the charge storage layer 33, and the block insulating film 34 are continuous films at the connection portion between the joint portion JT and the lower pillar LMP. Among the semiconductor layer 31, the charge storage layer 33, and the block insulating film 34, only the charge storage layer 33 has a thinned (reduced) film thickness at the connection portion between the joint portion JT and the lower pillar LMP.

The semiconductor layer 31 is connected from the portion JTc of the joint portion JT to the portion LMPa of the lower pillar LMP via the boundary IFd. The interface between the semiconductor layer 31 and the tunnel insulating film 32 forms an obtuse angle θu (θu>90 degrees) toward the outside of the memory pillar MP at the boundary IFd. That is, the semiconductor layer 31 in the portion LMPa extends in a direction approaching the center of the memory pillar MP as going downward from the boundary IFd. In other words, the diameter of the semiconductor layer 31 in the portion LMPa decreases in the downward direction from the boundary IFd. The semiconductor layer 31 in the portion LMPb extends in a direction gradually approaching the center of the memory pillar MP as going downward from the lower end of the portion LMPa than the semiconductor layer 31 in the portion LMPb. In other words, the diameter of the semiconductor layer 31 in the portion LMPb decreases at a slower rate than that of the semiconductor layer 31 in the portion LMPa in the downward direction from the lower end of the portion LMPa. Thus, the semiconductor layer 31 of the lower pillar LMP has a tapered shape having a two-step inclination.

The charge storage layer 33 and the block insulating film 34 are connected from the portion JTb of the joint portion JT to the portion LMPb of the lower pillar LMP without passing through the portion LMPa. The interface between the charge storage layer 33 and the block insulating film 34 forms an angle smaller than the angle θd and a right angle or an obtuse angle θd' (θd'<θd and θd'≥90 degrees) toward the outside of the memory pillar MP at the connection portion between the portion JTb and the portion LMPb. That is, the charge storage layer 33 and the block insulating film 34 in the portion LMPb extend in a direction approaching the center of the memory pillar MP as going downward from the connection portion between the portion JTb and the portion LMPb. In other words, the diameters of the charge storage layer 33 and the block insulating film 34 in the portion LMPb decrease at a slower rate than that of the semiconductor layer 31 in the downward direction from the connection portion between the portion JTb and the portion LMPb. The diameter of the portion 32c of the tunnel insulating film 32 in the portion LMPb decreases at a slower rate than that of the semiconductor layer 31 in the downward direction.

3.2 Manufacturing Method of Semiconductor Memory Device

Hereinafter, an example of a series of manufacturing processes from the formation of a stacked structure corresponding to the word lines WL to the formation of the select gate line SGD in the semiconductor memory device according to the third embodiment will be described. Each of FIGS. 26 to 30 illustrates an example of a cross-sectional structure including a structure corresponding to the memory cell array in the manufacturing process of the semiconductor memory device according to the third embodiment.

First, similarly to FIGS. 5 to 10 described in the first embodiment, a memory hole MH corresponding to the memory pillar MP is formed in a stacked body in which sacrificial materials 52 and 55 corresponding to the select gate line SGS, the word lines WL, and the select gate line SGD are stacked.

Figure 26:
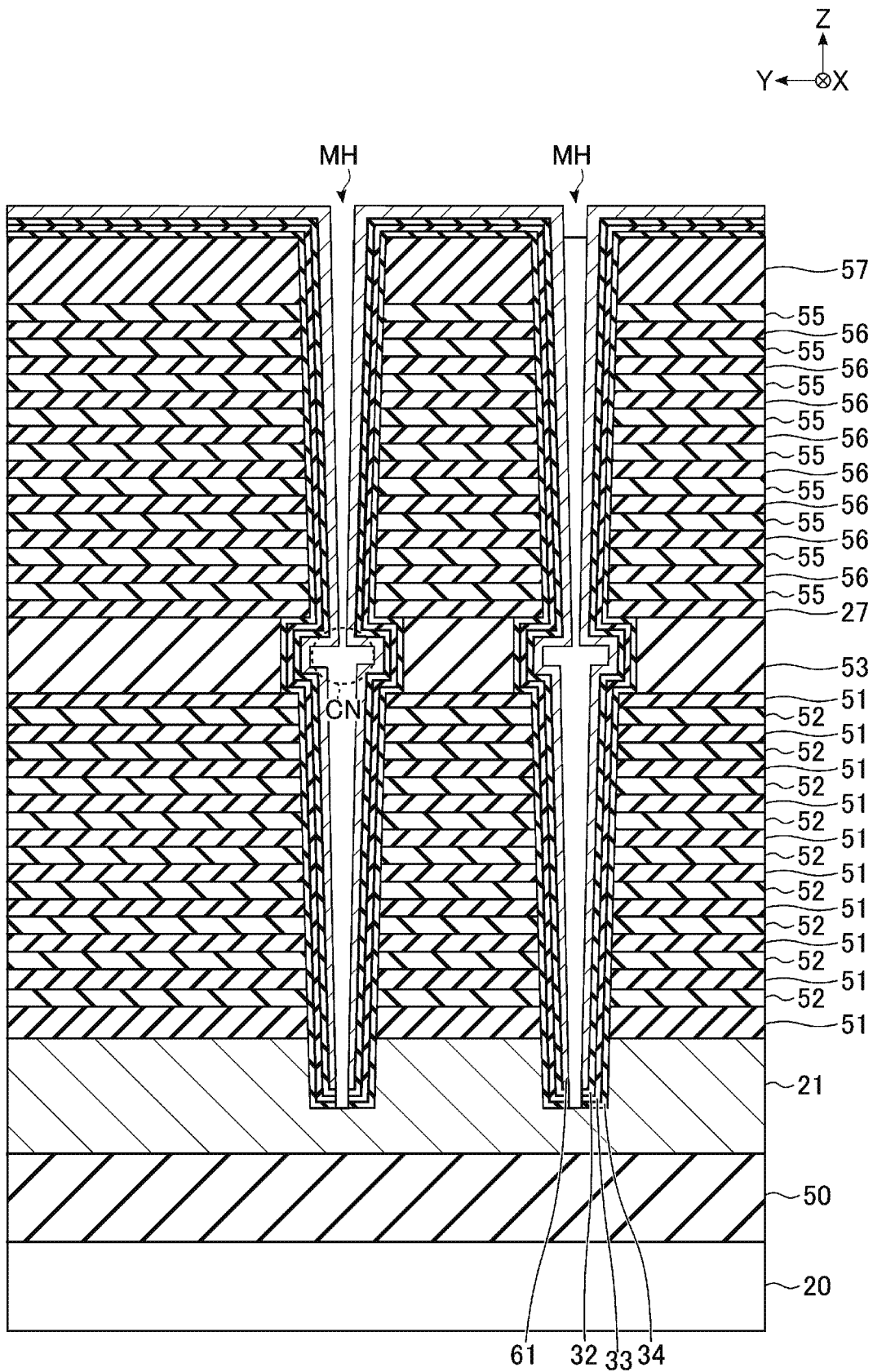
FIGS. 26 to 30 are cross-sectional views of a memory cell array for illustrating aspects of a manufacturing process of a semiconductor memory device.

Next, as illustrated in FIG. 26, the block insulating film 34, the charge storage layer 33, the tunnel insulating film 32, and a sacrificial material 61 are stacked in order in the memory hole MH. In the memory hole MH, the convex portion CN formed by combining a portion parallel to the layered surface (XY plane) of the sacrificial materials 52 and 55 and a portion parallel to the axis (Z axis) in which the memory hole MH extends is formed in the sacrificial material 61.

Figure 27:
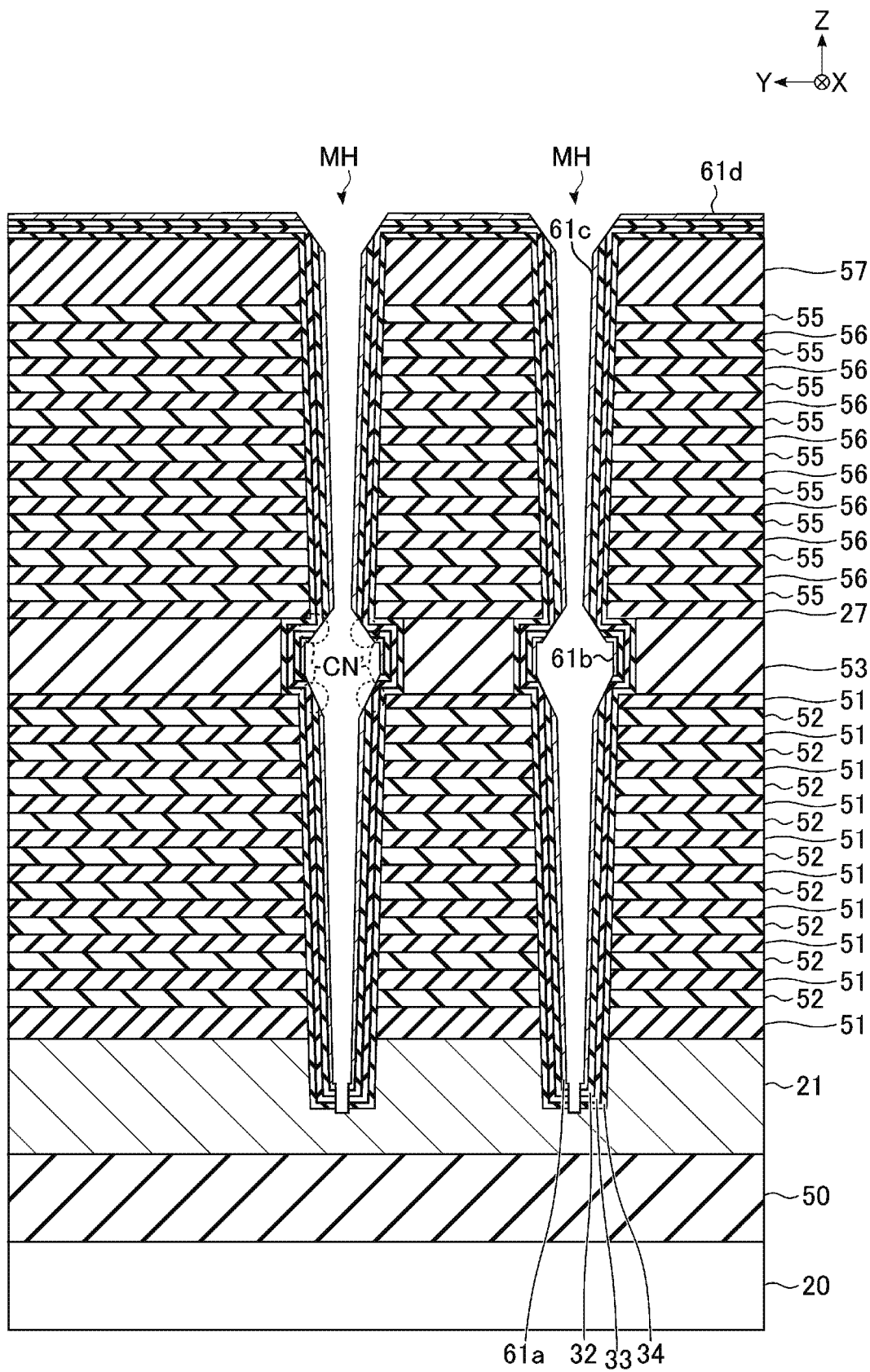

Next, as illustrated in FIG. 27, a part of the sacrificial material 61 is removed over the entire surface by sliming the sacrificial material 61 by isotropic etching. Here, the sacrificial material 61 formed in the convex portion CN in the memory hole MH is more easily etched than the sacrificial material 61 formed on a portion other than the convex portion CN (that is, on a flat surface). Therefore, when the sacrificial material 61 remains thin in the portions other than the convex portion CN, the sacrificial material 61 is completely removed at the convex portion CN, and a part of the tunnel insulating film 32 and the charge storage layer 33 at the convex portion CN is further cut off. As a result, a portion CN' including a surface that exposes the charge storage layer 33 and includes an oblique surface that intersects both the XY plane and the Z axis is formed in the memory hole MH.

Accordingly, the sacrificial material 61 is divided into four portions of a portion 61a formed below the insulator layer 53, a portion 61b formed on the insulator layer 53, and a portion 61c formed above the insulator layer 53 in the memory hole MH, and a portion 61d formed above the insulator layer 57 outside the memory hole MH.

Figure 28:
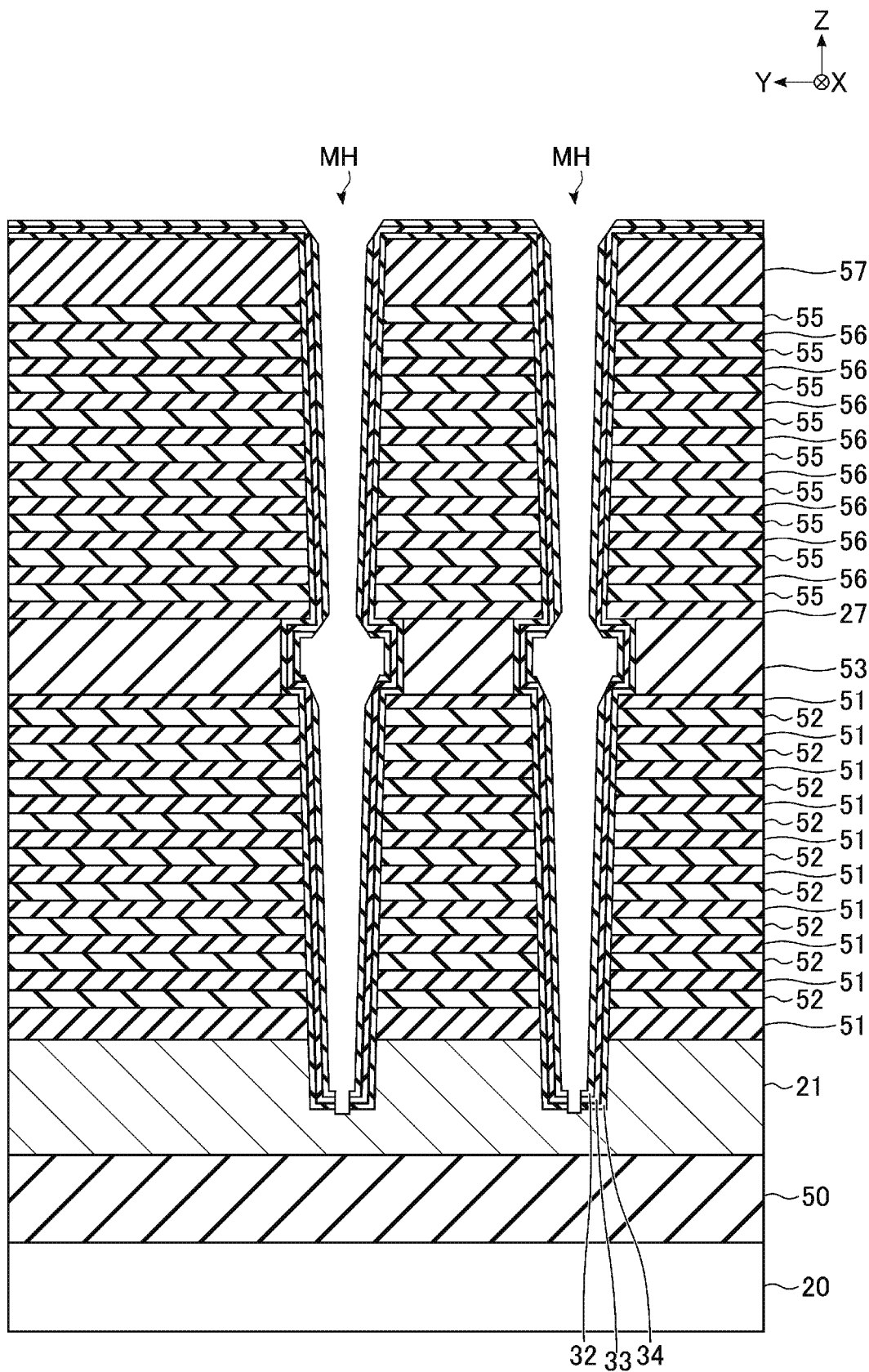

Next, as illustrated in FIG. 28, the portions 61a to 61d of the sacrificial material 61 remaining after the above-described slimming are selectively removed. As a result, the tunnel insulating film 32 is exposed at a portion other than the charge storage layer 33 exposed in the portion CN' in the memory hole MH. The removal in the process is performed, for example, by wet etching that can selectively remove silicon.

Figure 29:
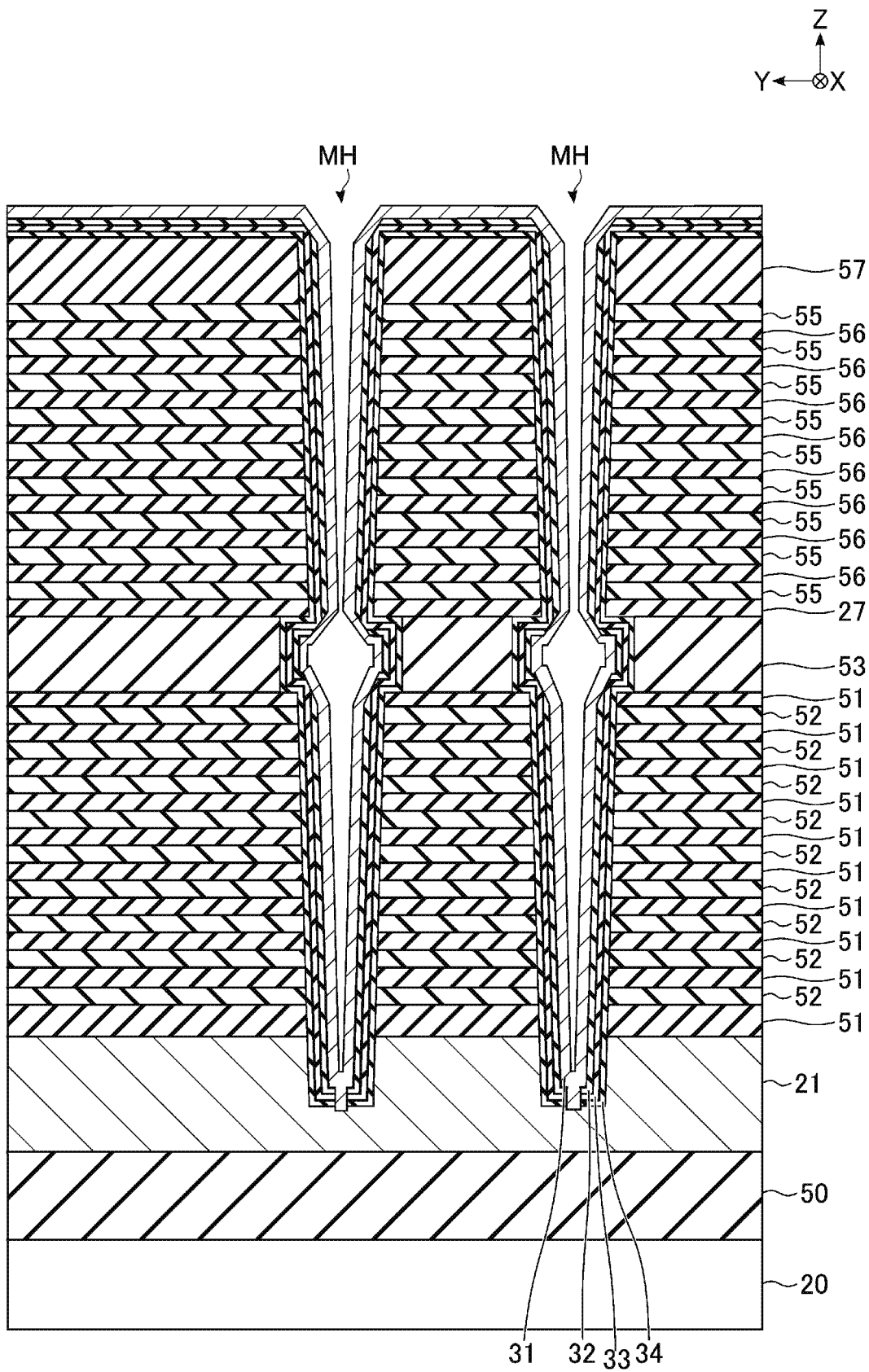

Next, as illustrated in FIG. 29, the semiconductor layer 31 is formed on the charge storage layer 33 exposed in the portion CN' and the tunnel insulating film 32 exposed in a portion other than the portion CN', and the semiconductor layer 31 is brought into contact with the contact layer 21. For example, CVD is used in the process. Thereafter, the semiconductor layer 31 is heated by annealing to change from an amorphous state to a crystalline state. In order to increase the grain size of the crystalline semiconductor layer 31, it is preferable that the semiconductor layer 31 be formed as thick as possible in the process.

Figure 30:
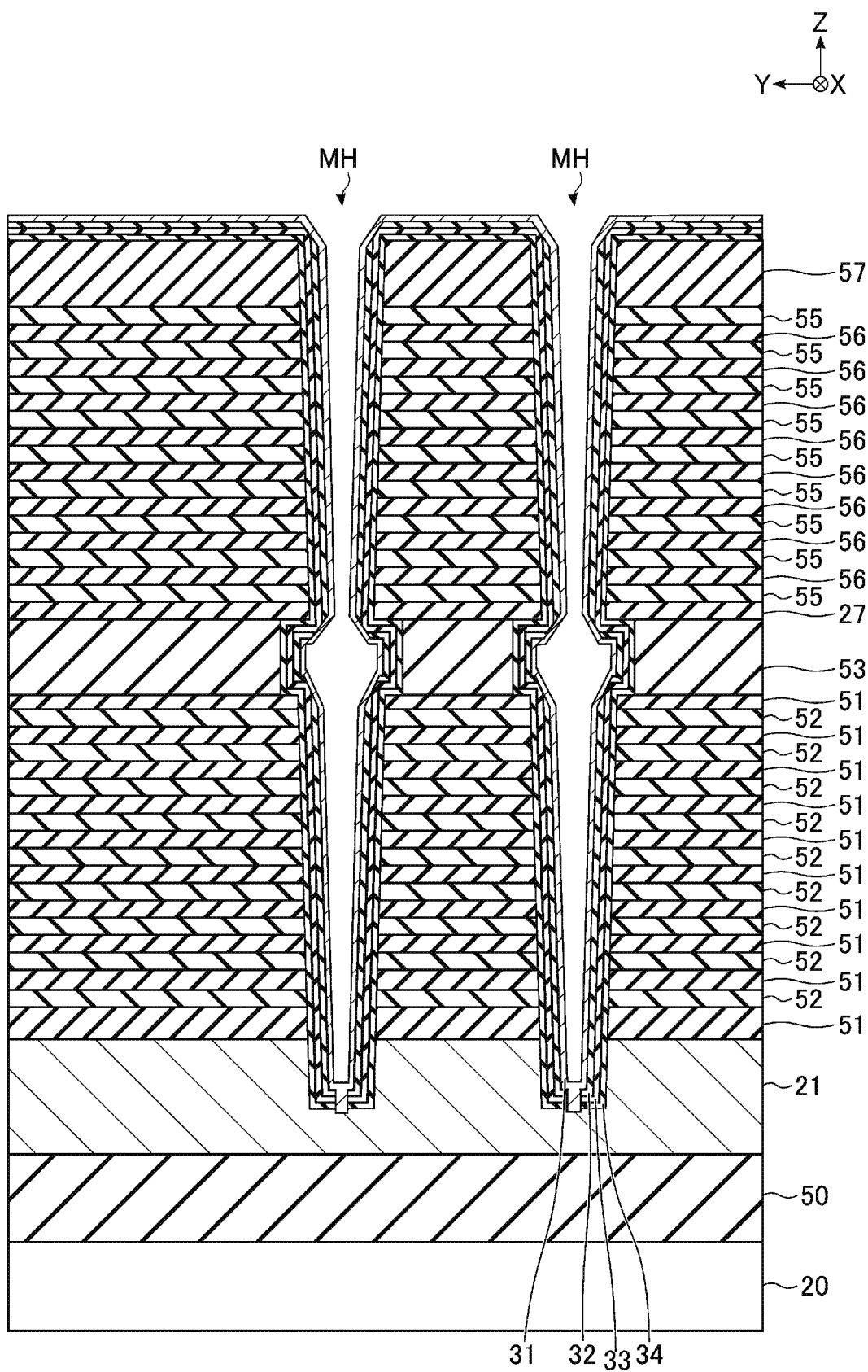

Next, as illustrated in FIG. 30, a part of the semiconductor layer 31 is removed over the entire surface by slimming the semiconductor layer 31 with isotropic etching. The slimming in the process is executed, for example, under the same conditions as the slimming described in FIG. 27. Unlike the case described with reference to FIG. 27, the convex portion CN in the memory hole MH is already etched into a portion CN' including an oblique surface. Thus, the etching rate of the portion CN' is equal to that of the portions other than the portion CN', and the semiconductor layer 31 is etched so that the film thickness is substantially uniform between the portion CN' and the other portions.

Thereafter, similarly to FIGS. 18 to 21 described in the first embodiment, the filling process of the core member 30 and the semiconductor portion 35 and the replacement process of the sacrificial materials 52 and 55 to the conductor layers 22 to 25 through the hole SLTH corresponding to the slit SLT are executed.

Through the manufacturing processes of the semiconductor memory device according to the third embodiment described above, the memory pillar MP, and the source line SL, the word lines WL, and the select gate lines SGS and SGD connected to the memory pillar MP are formed respectively.

3.3 Effects According to the Embodiment

According to the third embodiment, the tunnel insulating film 32 is divided between the joint portion JT and the upper pillar UMP. The charge storage layer 33 is formed as a continuous film, and the film thickness in the portion connecting the portion JTb and the portion UMPb is thinner than the film thickness in the other portions. As a result, the semiconductor layer 31 is formed not at the convex portion CN but is formed at the portion CN' forming an oblique surface in the memory hole MH. Therefore, as described with reference to FIGS. 29 and 30, the etching rate for the semiconductor layer 31 can be made more uniform regardless of the location inside the memory pillar MP during slimming performed in the formation of the semiconductor layer 31. Therefore, it is possible to reduce the film thickness of the semiconductor layer 31 while preventing the semiconductor layer 31 from being divided (becoming discontinuous) along the Z axis, and as a result, it is possible to excellently connect the current path in the memory pillar MP.

4. Modified Examples

The first embodiment, the second embodiment, and the third embodiment described above may be variously modified.

4.1 First Modified Example

For example, in the above-described third embodiment, the case where the tunnel insulating film 32 is divided at the connection portion between the joint portion JT and the upper pillar UMP or the lower pillar LMP has been described, but the present disclosure is not limited thereto. For example, the tunnel insulating film 32 and the charge storage layer 33 may be divided at the connection portion between the joint portion JT and the upper pillar UMP or the lower pillar LMP.

Figure 31:
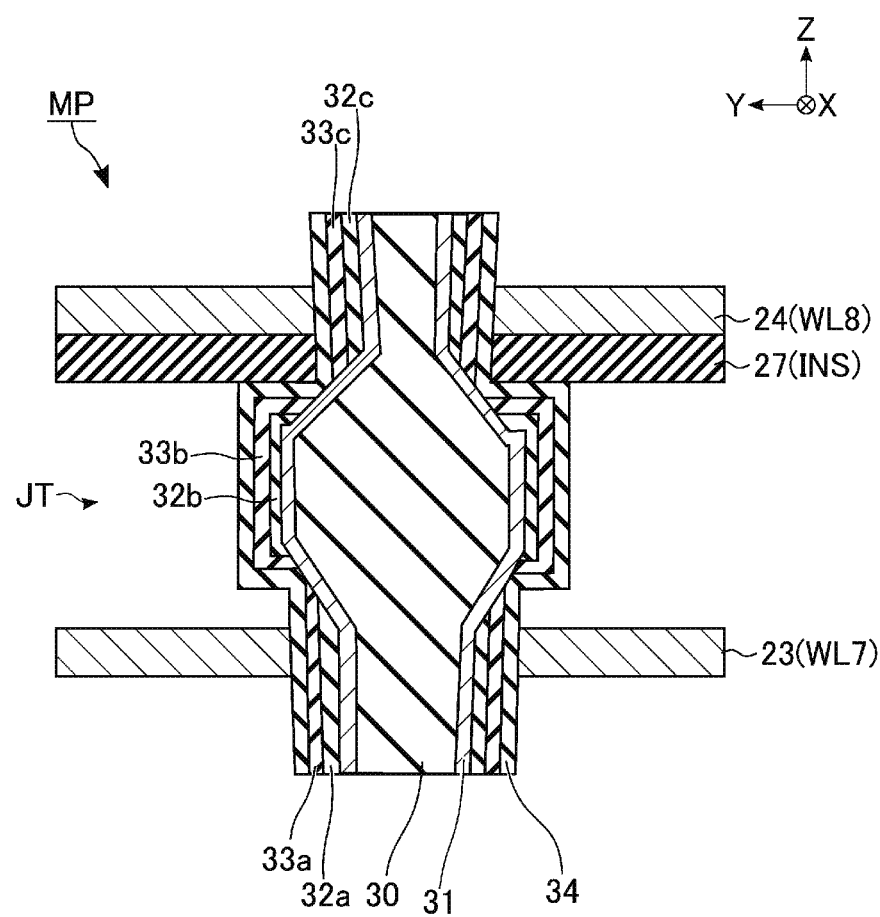
FIG. 31 is a cross-sectional view of a portion including a joint portion in a memory pillar of a semiconductor memory device according to a first modified example.

FIG. 31 is a cross-sectional view of a portion including the joint portion JT in the memory pillar MP of the semiconductor memory device according to the first modified example. FIG. 31 corresponds to FIG. 25 described in the third embodiment.

As illustrated in FIG. 31, the semiconductor layer 31 and the block insulating film 34 are continuous films at the connection portion between the joint portion JT and the upper pillar UMP or the lower pillar LMP. Between the semiconductor layer 31 and the block insulating film 34, the block insulating film 34 has a thin film thickness at the connection portion between the joint portion JT and the upper pillar UMP or the lower pillar LMP.

The tunnel insulating film 32 is divided into a portion 32a corresponding to the lower pillar LMP, a portion 32b corresponding to the joint portion JT, and a portion 32c corresponding to the upper pillar UMP. The charge storage layer 33 is divided into a portion 33a corresponding to the lower pillar LMP, a portion 33b corresponding to the joint portion JT, and a portion 33c corresponding to the upper pillar UMP.

In the case of forming the configuration as described above, for example, in the slimming process in FIG. 27 described in the third embodiment, the film thickness of the remaining sacrificial material 61 is adjusted to be thinner. As a result, the etching amount of the stacked films can be made thicker in the convex portion CN, and all of the charge storage layer 33 can be removed in addition to the tunnel insulating film 32. Therefore, in the portion CN' formed by slimming, a structure in which the block insulating film 34 is exposed is formed, and the structure illustrated in FIG. 31 can be formed by subsequently performing the same processes as in the third embodiment.

4.2 Second Modified Example

For example, the tunnel insulating film 32 may not be divided at the connection portion between the joint portion JT and the upper pillar UMP or the lower pillar LLMP.

Figure 32:
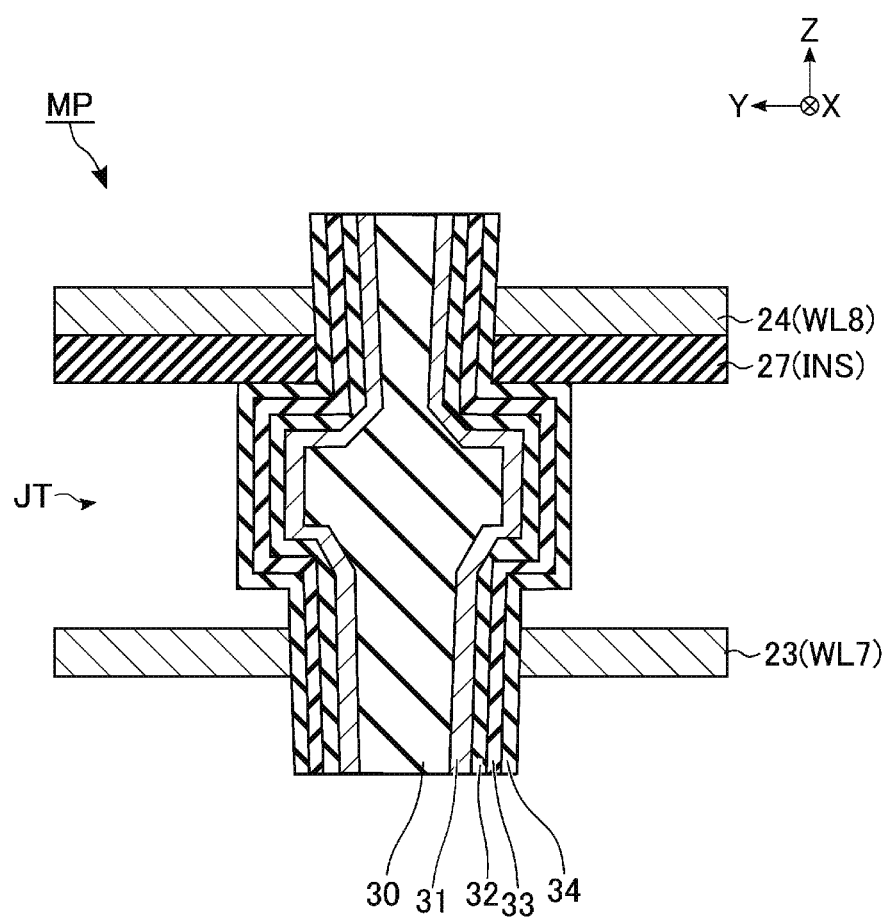
FIG. 32 is a cross-sectional view of a portion including a joint portion in a memory pillar of a semiconductor memory device of a second modified example.

FIG. 32 is a cross-sectional view of a portion including the joint portion JT in the memory pillar MP of the semiconductor memory device according to the second modified example. FIG. 32 corresponds to FIG. 25 described in the third embodiment.

As illustrated in FIG. 32, the semiconductor layer 31, the tunnel insulating film 32, the charge storage layer 33, and the block insulating film 34 are continuous films at the connection portion between the joint portion JT and the upper pillar UMP or the lower pillar LMP. Among the semiconductor layer 31, the tunnel insulating film 32, the charge storage layer 33, and the block insulating film 34, the tunnel insulating film 32 has a thin film thickness at the connection portion between the joint portion JT and the upper pillar UMP or the lower pillar LMP.

In the case of forming the configuration as described above, for example, in the slimming process in FIG. 27 described in the third embodiment, the remaining sacrificial material 61 is adjusted to be thicker. Thus, in the convex portion CN, the etching amount of the stacked films can be made thinner, and a part of the tunnel insulating film 32 can be removed. Therefore, in the portion CN' formed by slimming, a structure in which the tunnel insulating film 32 is exposed is formed, and the structure illustrated in FIG. 32 can be formed by subsequently performing the same processes as in the third embodiment.

In any case of the first modified example and the second modified example, as in the third embodiment, the upper pillar UMP can form a constricted shape, and the minimum value of the diameter of the memory hole MH can be increased. Therefore, when the conductor layer 21 is exposed by etching the bottom of the memory hole MH, the opening area can be increased, and as a result, the contact between the semiconductor layer 31 and the conductor layer 21 can be improved. Therefore, the current path in the memory pillar MP can be connected well.

Since the convex portion CN is cut off, the etching rate for the semiconductor layer 31 can be made uniform regardless of the location inside the memory pillar MP during slimming performed in the formation of the semiconductor layer 31. Therefore, it is possible to reduce the film thickness of the semiconductor layer 31 while preventing the semiconductor layer 31 from being divided along the Z axis, and as a result, it is possible to excellently connect the current path in the memory pillar MP.

4.3 Other Modifications

In each of the above embodiments, the case where the semiconductor memory device 1 has a structure in which a circuit such as the sense amplifier module 16 and the like is provided under the memory cell array 10 is described as an example, but the present disclosure is not limited thereto. For example, the semiconductor memory device 1 may have a structure in which the memory cell array 10, the sense amplifier module 16, and the like are formed on the semiconductor substrate 20. The semiconductor memory device 1 may have a structure in which a chip provided with the sense amplifier module 16 and the like and a chip provided with the memory cell array 10 are bonded together.

In the above embodiments, the word lines WL and the select gate line SGS are adjacent to each other, and the word lines WL and the select gate line SGD are adjacent to each other. However, the present disclosure is not limited thereto. For example, a dummy word line may be provided between the uppermost word line WL and the select gate line SGD. Similarly, a dummy word line may be provided between the lowermost word line WL and the select gate line SGS. In the case of a structure in which a plurality of pillars are connected, a conductor layer in the vicinity of the connection portion may be used as a dummy word line.

In each of the above embodiments, the case where the semiconductor layer 31 and the conductor layer 21 are electrically connected via the bottom of the memory pillar MP is illustrated, but the present disclosure is not limited thereto. The semiconductor layer 31 and the conductor layer 21 may be electrically connected via the side surface of the memory pillar MP. In such a case, a part of the stacked films formed on the side surface of the memory pillar MP is removed, and a structure in which the semiconductor layer 31 and the conductor layer 21 are in contact with each other through the part is formed.

In the case where the semiconductor memory device 1 has a structure in which the memory cell array 10, the sense amplifier module 16, and the like are formed on the semiconductor substrate 20, for example, conductive single crystal silicon is epitaxially grown on the conductive region formed on the semiconductor substrate and the memory pillar MP is disposed thereon. The conductive region and the semiconductor layer 31 are electrically connected through the conductive single crystal silicon and the bottom of the memory pillar MP.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor memory device, comprising:
   a stacked body including a plurality of first conductor layers and a plurality of second conductor layers above the plurality of first conductor layers in a first direction;
   a pillar including a semiconductor layer, the pillar extending along the first direction within the stacked body; and
   a charge storage layer between the plurality of first conductor layers and the semiconductor layer and between the plurality of second conductor layers and the semiconductor layer, wherein
   the semiconductor layer includes:
      a first portion extending along the first direction from an uppermost first conductor layer among the plurality of first conductor layers to a lowermost second conductor layer among the plurality of second conductor layers;
      a second portion above the first portion in the first direction;
      a third portion above the second portion in the first direction, the third portion having a diameter that increases with increasing distance along the first direction from the second portion;
      a fourth portion below the first portion in the first direction, the fourth portion having a diameter that decreases at a first rate with increasing distance from the first portion along the first direction; and
      a fifth portion below the fourth portion in the first direction, the fifth portion having a diameter that decreases at a second rate with increasing distance from the first portion along the first direction, the second rate being lower than the first rate, and
   the second portion has a diameter that decreases with increasing distance along the first direction from the first portion.

2. The semiconductor memory device according to claim 1 wherein a lower surface of the lowermost second conductor layer intersects a surface of a portion of the lowermost second conductor layer facing the third portion of the semiconductor layer.

3. The semiconductor memory device according to claim 1, wherein
   the charge storage layer includes:
      a first charge storage layer portion extending along the first direction between the uppermost first conductor layer and the lowermost second conductor layer, and
      a second charge storage layer portion above the first charge storage layer portion and having a diameter that increases with distance upward along the first direction, and
   the first charge storage layer portion and the second charge storage layer portion are continuous films.

4. The semiconductor memory device according to claim 3, wherein
   the charge storage layer further includes:
      a fifth charge storage layer portion connecting the first charge storage layer portion and the second charge storage layer portion, and
   a film thickness of the fifth charge storage layer portion is less than a film thickness of the first charge storage layer portion and less than a film thickness of the second charge storage layer portion.

5. The semiconductor memory device according to claim 3, wherein the charge storage layer further includes:
   a third charge storage layer portion between the first and second charge storage layer portions, the third charge storage layer portion having a diameter that decreases with distance upward along the first direction between the first charge storage layer portion and the second charge storage layer portion.

6. The semiconductor memory device according to claim 5, wherein the charge storage layer further includes:
   a fourth charge storage layer portion extending in a second direction crossing the first direction, the fourth charge storage layer portion being between the first charge storage layer portion and the third charge storage layer portion.

7. The semiconductor memory device according to claim 1, wherein the lowermost second conductor layer has a surface facing the second portion of the semiconductor layer.

8. The semiconductor memory device according to claim 1, further comprising:
   a first insulator layer between the charge storage layer and the semiconductor layer, wherein
   the first insulator layer includes:
      a first insulating portion extending along the first direction between the uppermost first conductor layer and the lowermost second conductor layer, and
      a second insulating portion above the first insulating portion and having a diameter that increases with distance upwards in the first direction, and the first insulating portion and the second insulating portion of the first insulator layer are separated.

9. The semiconductor memory device according to claim 8, wherein
the charge storage layer includes:
   a first charge storage layer portion extending along the first direction between the uppermost first conductor layer and the lowermost second conductor layer, and
   a second charge storage layer portion above the first charge storage layer portion in the first direction and having a diameter that increases with distance upward along the first direction, and
the first charge storage layer portion and the second charge storage layer portion are separated.

10. The semiconductor memory device according to claim 9, further comprising:
a second insulator layer between the plurality of first conductor layers and the charge storage layer and between the plurality of second conductor layers and the charge storage layer, wherein
the second insulator layer includes:
   a first portion extending along the first direction between the uppermost first conductor layer and the lowermost second conductor layer, and
   a second portion above the first portion of the second insulator layer in the first direction and having a diameter that increases with distance upward along the first direction, and
the first portion of the second insulator layer and the second portion of the second insulator layer are continuous films.

11. The semiconductor memory device according to claim 10, wherein
the second insulator layer further includes:
   a third portion connecting the first portion of the second insulator layer and the second portion of the second insulator layer, and
   a film thickness of the third portion of the second insulator layer is less than a film thickness of the first portion of the second insulator layer and a film thickness of the second portion of the second insulator layer.

12. The semiconductor memory device according to claim 1, further comprising:
a first insulator layer between the charge storage layer and the semiconductor layer, wherein
the first insulator layer includes:
   a first portion extending along the first direction between the uppermost first conductor layer and the lowermost second conductor layer, and
   a second portion above the first portion of the first insulator layer in the first direction and having a diameter that increases with distance upward along the first direction, and
the first portion of the first insulator layer and the second portion of the first insulator layer are continuous films.

13. The semiconductor memory device according to claim 12, wherein
the first insulator layer further includes:
   a third portion connecting the first portion of the first insulator layer and the second portion of the first insulator layer, and
   a film thickness of the third portion of the first insulator layer is less than a film thickness of the first portion of the first insulator layer and less than a film thickness of the second portion of the first insulator layer.

14. The semiconductor memory device according to claim 1, wherein a distance along the first direction between the uppermost first conductor layer and the lowermost second conductor layer is greater than a distance along the first direction between adjacent first conductor layers of the plurality of first conductor layers, and greater than a distance along the first direction between adjacent second conductor layers of the plurality of second conductor layers.

* * * * *